United States Patent
Hoya

(10) Patent No.: US 12,217,781 B2
(45) Date of Patent: Feb. 4, 2025

(54) MEMORY DEVICE AND MEMORY SYSTEM

(71) Applicant: Kioxia Corporation, Tokyo (JP)

(72) Inventor: Katsuhiko Hoya, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 170 days.

(21) Appl. No.: 18/180,021

(22) Filed: Mar. 7, 2023

(65) Prior Publication Data

US 2023/0420021 A1 Dec. 28, 2023

(30) Foreign Application Priority Data

Jun. 23, 2022 (JP) ................................. 2022-100915

(51) Int. Cl.
*G11C 16/08* (2006.01)
*G06F 12/02* (2006.01)
*G11C 11/16* (2006.01)
*G11C 13/00* (2006.01)

(52) U.S. Cl.
CPC ...... *G11C 11/1673* (2013.01); *G06F 12/0238* (2013.01); *G11C 11/1675* (2013.01); *G11C 13/0023* (2013.01)

(58) Field of Classification Search
USPC .................................................... 365/185.17
See application file for complete search history.

(56) References Cited

U.S. PATENT DOCUMENTS

| | | |
|---|---|---|
| 9,158,672 B1 | 10/2015 | Zheng et al. |
| 9,852,812 B2 | 12/2017 | Iwaki et al. |
| 11,216,364 B2 | 1/2022 | Guda et al. |
| 2017/0315737 A1 | 11/2017 | Kajigaya |
| 2017/0365335 A1* | 12/2017 | Wang ..................... G11C 16/08 |
| 2019/0332322 A1 | 10/2019 | Kown et al. |
| 2020/0201781 A1 | 6/2020 | Jain et al. |
| 2022/0083273 A1 | 3/2022 | Saito |

FOREIGN PATENT DOCUMENTS

| | | |
|---|---|---|
| JP | 5579431 B2 | 7/2014 |
| JP | 2015118499 A | 6/2015 |
| JP | 2022050016 A | 3/2022 |
| JP | 2022051902 A | 4/2022 |

\* cited by examiner

*Primary Examiner* — Jason Lappas
(74) *Attorney, Agent, or Firm* — Holtz, Holtz & Volek PC

(57) ABSTRACT

According to one embodiment, a memory device includes: a first bank including a first memory cell; a second bank including a second memory cell; and a buffer circuit configured to temporarily stores data, wherein, during a read sequence for the first memory cell, the first bank is configured to: sense a first signal from the first memory cell, set the first memory cell to a reset state after the first signal is sensed, sense a second signal from the first memory cell in the reset state, determine first data stored in the first memory cell, based on the first signal and the second signal, and store the first data in the buffer circuit, and the second bank is configured to: write the first data in the buffer circuit to the second memory.

19 Claims, 14 Drawing Sheets

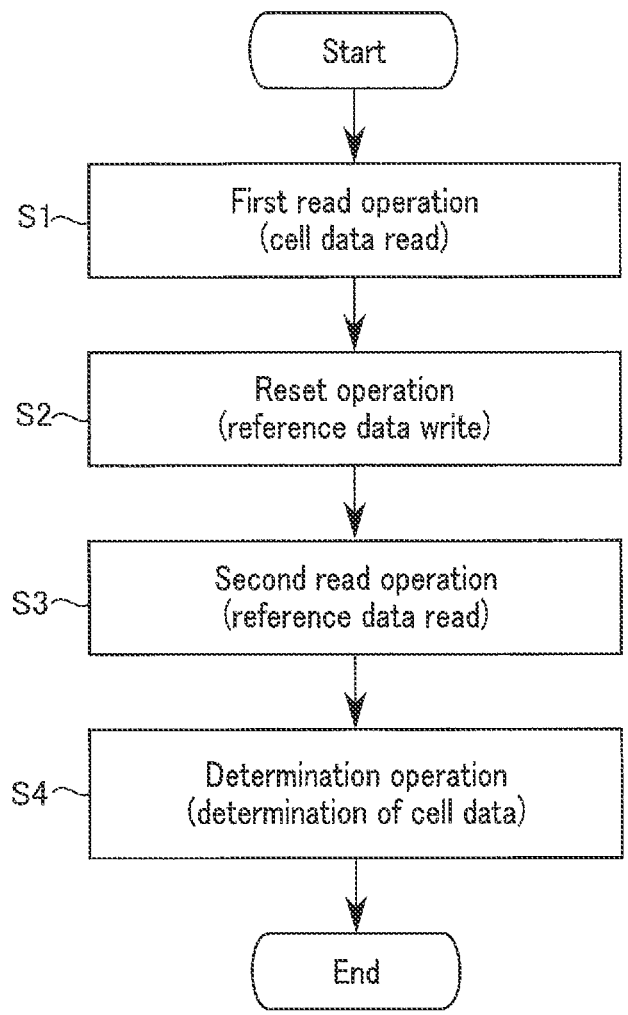
F I G. 8

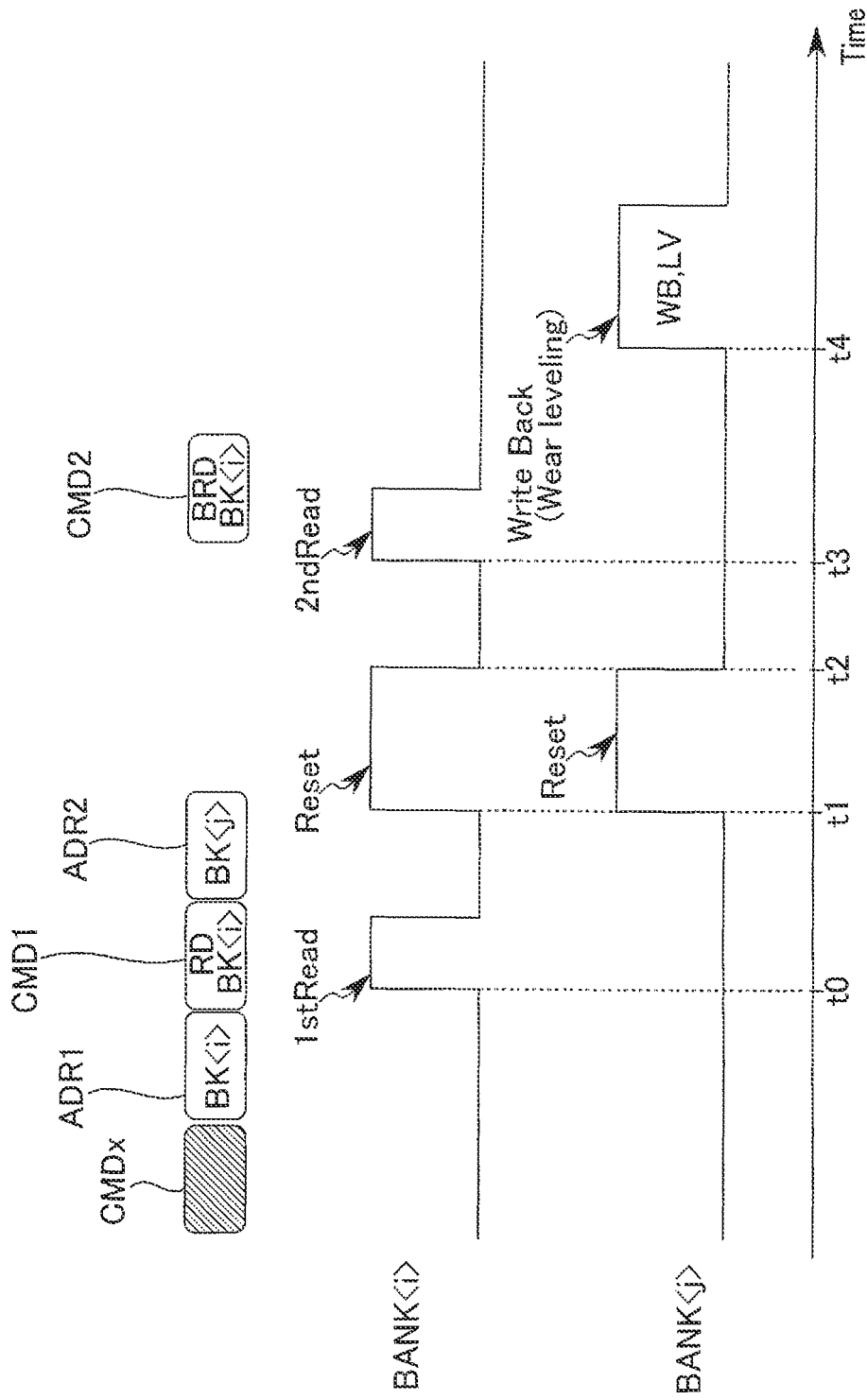
F I G. 13

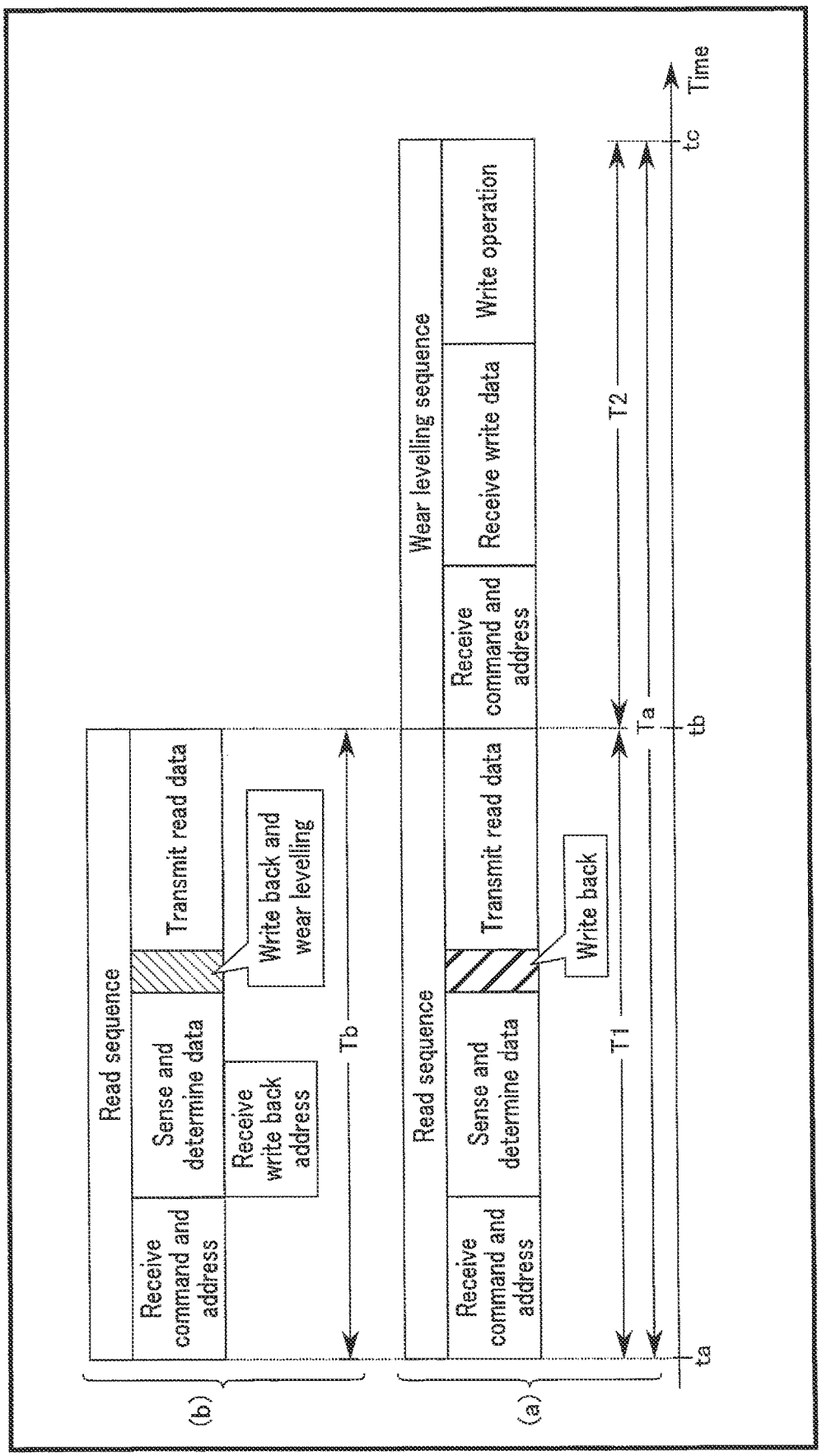
F I G. 14

MEMORY DEVICE AND MEMORY SYSTEM

CROSS-REFERENCE TO RELATED APPLICATIONS

This application is based upon and claims the benefit of priority from Japanese Patent Application No. 2022-100915, filed Jun. 23, 2022, the entire contents of which are incorporated herein by reference.

FIELD

Embodiments described herein relate generally to a memory device and a memory system.

BACKGROUND

A memory device is known in which a variable resistance element, such as a magnetoresistance effect element, is used as a memory element.

BRIEF DESCRIPTION OF THE DRAWINGS

FIG. 8 is a flowchart showing an operation example of the memory device according to the embodiment.
FIG. 13 is a diagram showing an example of a modification of the memory device of the embodiment.
FIG. 14 is a diagram showing a comparative example of the memory device of the embodiment.

DETAILED DESCRIPTION

Hereinafter, embodiments will be described in detail with reference to the accompanying drawings. In the description below, elements having the same functions and configurations will be denoted by the same reference symbols.

In the embodiments described below, where constituent elements denoted by reference symbols to which numbers/letters are attached at the end for discrimination (e.g., circuits, interconnects, and various voltages and signals) do not have to be discriminated from each other, reference symbols without the numbers/letters at the end will be used.

In general, according to one embodiment, a memory device includes: a first bank including a first memory cell; a second bank including a second memory cell; and a buffer circuit configured to temporarily stores data, wherein, during a read sequence for the first memory cell, the first bank is configured to: sense a first signal from the first memory cell, set the first memory cell to a reset state after the first signal is sensed, sense a second signal from the first memory cell in the reset state, determine first data stored in the first memory cell, based on the first signal and the second signal, and store the first data in the buffer circuit, and the second bank is configured to: write the first data in the buffer circuit to the second memory.

EMBODIMENTS

Memory devices and memory systems according to embodiments will be described with reference to FIGS. 1 to 14.

(1) Configuration Example

A memory device and a memory system according to an embodiment will be described with reference to FIG. 1 to FIG. 7.

(1-1) Overall Configuration

Figure 1:
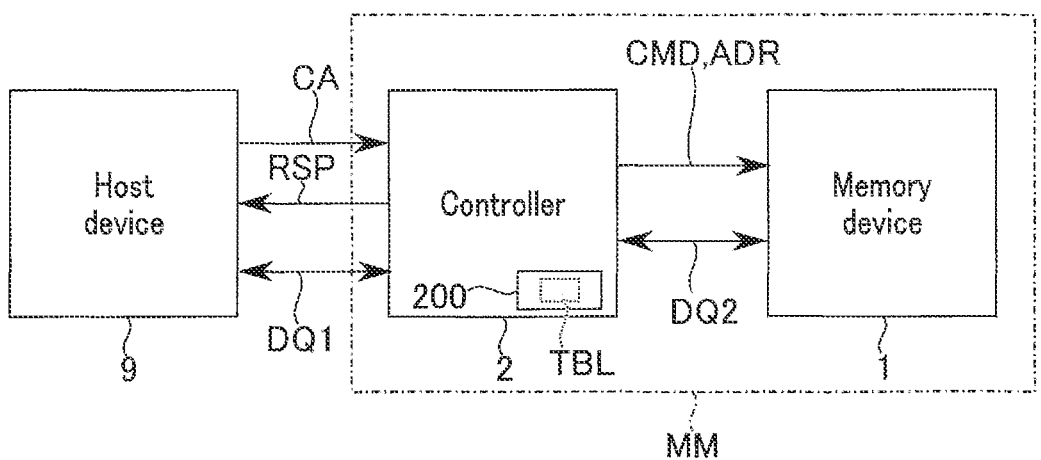
FIG. 1 is a block diagram showing a configuration example of a memory system according to an embodiment.

FIG. 1 is a schematic diagram for illustrating a memory system according to the present embodiment.

As shown in FIG. 1, the memory system (hereinafter referred to as a memory module as well) MM of the present embodiment is electrically coupled to a host device 9.

The memory device 1 of the present embodiment is electrically coupled to a controller (also referred to as a memory controller or simply as a controller) 2 in the memory module. The memory device 1 stores data.

The controller 2 can command the memory device 1 to write data, read data, and erase data. The controller 2 manages the memory space (address space) within the memory device 1. For example, the controller 2 holds information (hereinafter referred to as a management table) TBL for managing a plurality of addresses of the memory space of the memory device 1. For example, the controller 2 includes a memory 200 that stores management table TBL.

For example, the controller 2 monitors the number of times data is written (and read) for each address in response to a command in the memory device 1. The controller 2 reflects the monitoring results in the management table TBL.

The host device 9 can request and command the memory module MM to write data to the memory device 1, read data from the memory device 1, erase data from the memory device 1, and the like.

For example, the memory module MM communicates data or the like with the host device 9.

The host device 9 sends a command address signal CA to the controller 2 in accordance with the operation requested to the memory module MM.

In accordance with the command address signal CA, the controller 2 can recognize the operation (operation to be executed) requested by the host device 9 and can also recognize a target of the operation (address).

The controller 2 sends a response signal RSP to the host device 9. The response signal RSP indicates the operational statuses of the memory module MM and the memory device 1. For example, in a read sequence, the host device 9 can request data read from the memory module MM in response to the response signal RSP.

Data DQ1 is transferred between the controller 2 and the host device 9. The data DQ1 is a set of 1-bit signals.

For example, various signals (information) regarding error detection and correction are transferred between the controller 2 and the host device 9 together with the data DQ1.

The controller 2 generates a command CMD and an address ADR, based on the command address signal CA supplied from the host device 9. The controller 2 sends the command CMD and the address ADR to the memory device 1.

The memory device 1 executes the operation based on the command CMD for the operation target indicated by the address ADR.

Data DQ2 is transferred between the memory device 1 and the controller 2. The data DQ2 is a set of 1-bit signals.

The memory device 1 of the present embodiment is a nonvolatile random access memory. For example, the memory device 1 of the present embodiment is an MRAM (Magnetoresistive RAM).

(1-2) Configuration Example of Memory Device 1

The internal configuration of the memory device 1 of the present embodiment will be described with reference to FIGS. 2 and 3.

Figure 2:
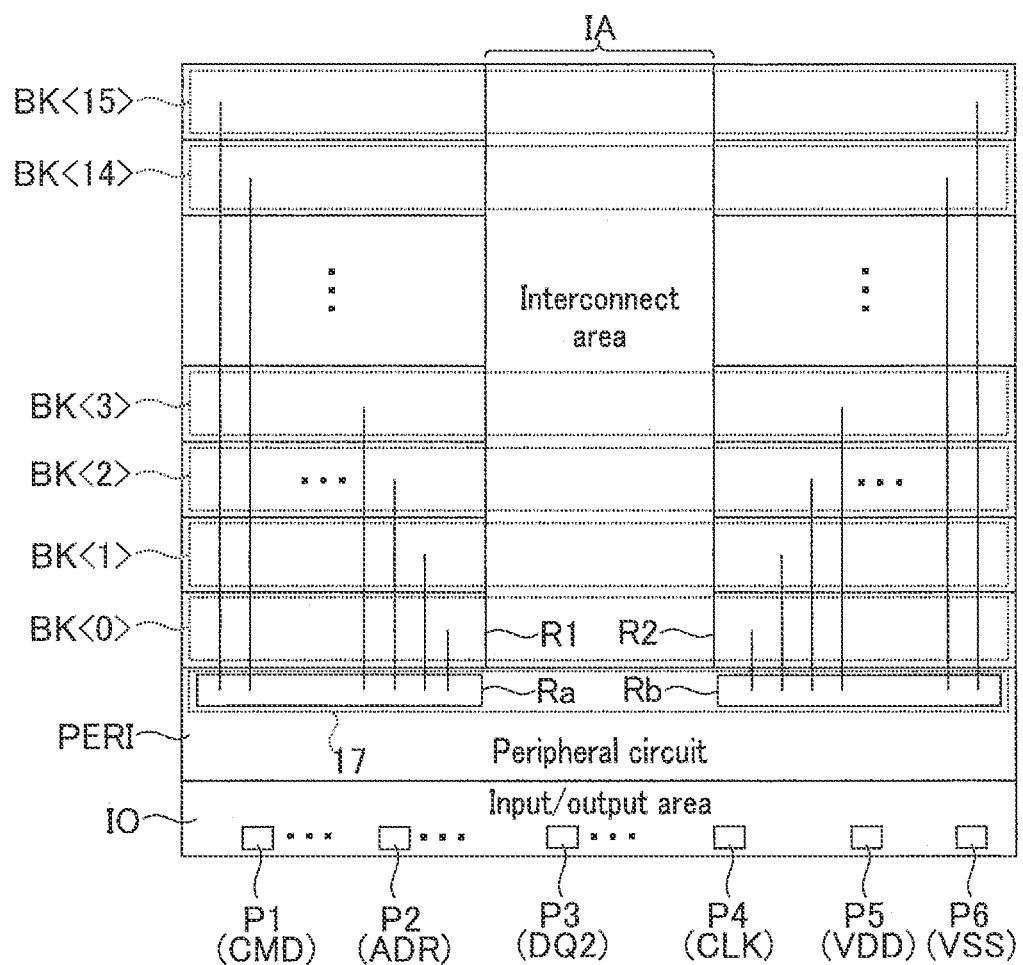
FIG. 2 is a layout diagram showing a configuration example of a memory device according to the embodiment.

FIG. 2 is a plan view showing the internal layout of a chip of the memory device 1 of the present embodiment.

As shown in FIG. 2, the memory device 1 of the present embodiment includes a plurality of banks BK (BK<0>, BK<1>, . . . BK<15>), a peripheral circuit PERI and an input/output area IO.

Each bank BK stores data. Each of the plurality of banks BK is configured such that each bank BK can operate independently of each other.

Each bank BK is divided into two regions R1 and R2 sandwiching an interconnect area IA and provided within the chip. The two regions R1 and R2 of each bank BK are electrically coupled via an interconnect provided in the interconnect area IA.

Each bank BK will be hereinafter referred to as a core circuit as well. A set of a plurality of banks BK is referred to as a memory core as well.

The interconnect area IA includes a plurality of interconnects coupling the plurality of banks BK and the peripheral circuit PERI.

The peripheral circuit PERI includes a plurality of circuits for controlling operation of the banks BK. For example, the peripheral circuit PERI includes a bank buffer circuit 17.

The bank buffer circuit 17 temporarily stores data input to the bank BK and data output from the bank BK. The bank buffer circuit 17 is provided in the neighborhood of the bank BK. The bank buffer circuit 17 is commonly coupled to a plurality of banks BK. The bank buffer circuit 17 includes two circuit regions Ra and Rb which are divided in correspondence to banks BK.

The input/output area IO includes a plurality of terminals P1, P2, P3, P4, P5 and P6 for the memory device 1 to communicate with the controller 2.

Corresponding signals CMD, ADR, DQ2, CLK and voltages VDD and VSS are supplied to the plurality of terminals P1, P2, P3, P4, P5 and P6, respectively.

Figure 3:
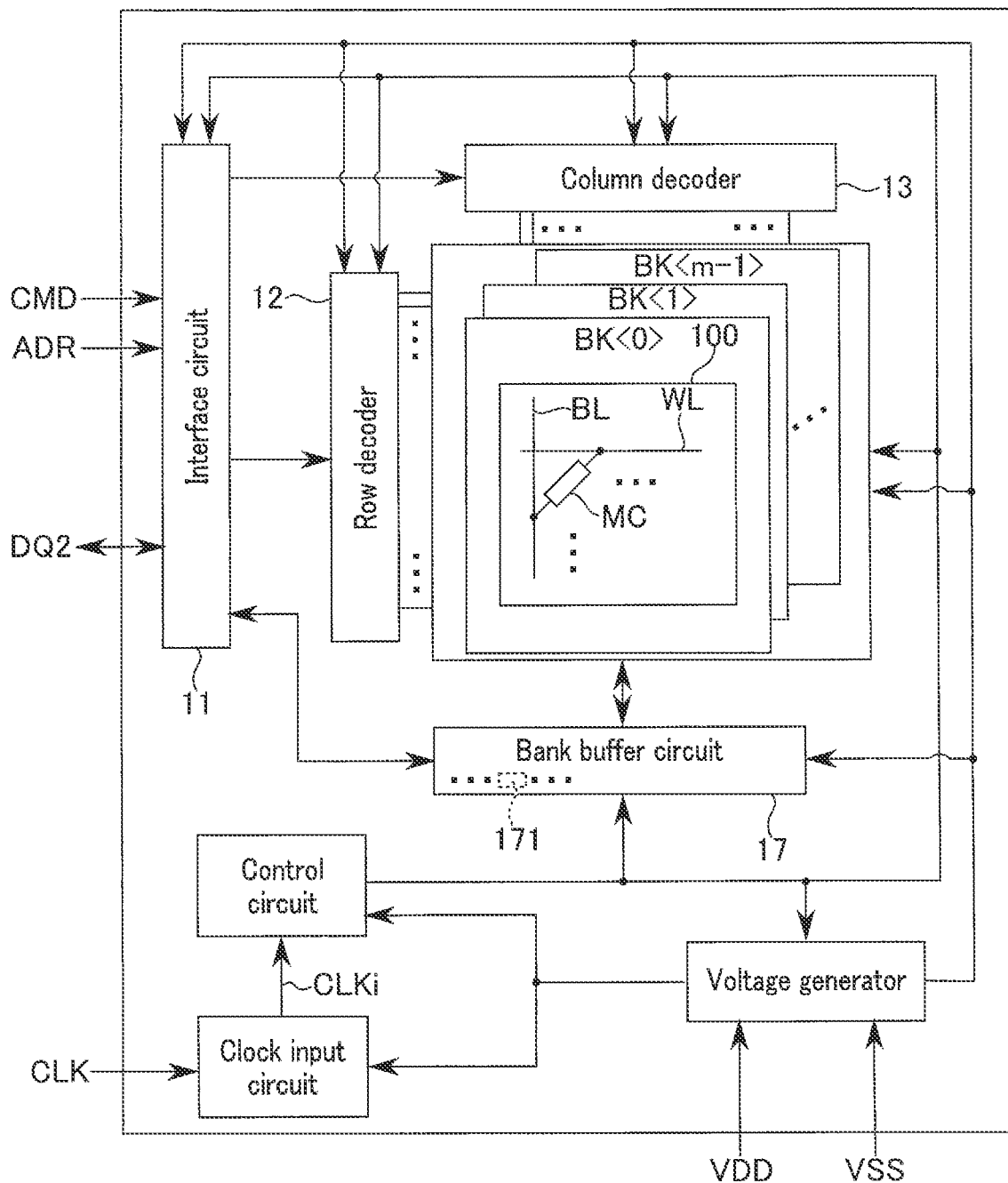
FIG. 3 is a block diagram showing a configuration example of the memory device according to the embodiment.

FIG. 3 is a block diagram showing an example of the internal configuration of the memory device 1 of the present embodiment.

As shown in FIG. 3, the memory device 1 includes an interface circuit 11, a row decoder 12, a column decoder 13, a voltage generation circuit 15, a clock generation circuit 16, a bank buffer circuit 17, a control circuit 19, etc., which are peripheral circuits (CMOS circuits) PERI for controlling operations of the plurality of banks BK.

Each of the plurality of banks BK (BK<0>, BK<1>, . . . BK<m−1>) includes at least a memory cell array 100. Here, m is an integer not less than 2. For example, m is 16. The memory cell array 100 includes a plurality of memory cells MC, a plurality of word lines WL and a plurality of bit lines BL. The memory cells MC are coupled to the word lines WL and the bit lines BL. The memory cell MC can store one or more bits of data.

Details of the internal configuration of the banks 10 and the memory cell array 100 will be described later.

The interface circuit 11 functions as an interface between the memory device 1 and the controller 2.

The interface circuit 11 receives commands CMD and addresses ADR from the controller 2. The interface circuit 11 sends the commands CMD to the control circuit 19. The interface circuit 11 sends addresses ADR to the row decoder 12 and the column decoder 13.

The interface circuit 11 receives data to be written to the memory cell array 100 from the controller 2. The interface circuit 11 sends data read from the memory cell array 100 to the controller 2.

In the description below, data written to the memory cell array 100 will be referred to as write data. Data read from the memory cell array 100 is will be referred to as read data.

The row decoder 12 receives an address ADR from the interface circuit 11. The row decoder 12 decodes the row address included in the address ADR. The row decoder 12 sends a decode signal indicating the decoding result of the row address to the bank BK.

The column decoder 13 receives an address ADR from the interface circuit 11. The column decoder 13 decodes the column address included in the address ADR. The column decoder 13 sends a decode signal indicating the decoding result of the column address to the bank BK.

The voltage generation circuit 15 generates various voltages used for executing the operation sequence of the memory device 1. The voltage generation circuit 15 supplies the generated voltages to the corresponding banks BK and each of the circuits 11, 12, 13, 16, 17 and 19.

The clock generation circuit 16 receives an external clock CLK from the controller 2 (or from the host device 9).

Based on the external clock CLK, the clock generation circuit 16 generates an internal clock CLKi used inside the memory device 1. The clock generation circuit 16 sends the generated internal clock CLKi to the control circuit 19 and/or each of the circuits 11, 12, 13 and 17.

The bank buffer circuit 17 can temporarily store data read from each bank BK and data written to each bank BK. For example, the bank buffer circuit 17 can store data having a data size of at least one page. For example, the bank buffer circuit 17 includes a plurality of buffers 171. Each buffer 171 can store 1-bit data. The bank buffer circuit 17 is referred to as a buffer circuit or a page buffer circuit as well.

The control circuit (also referred to as a sequencer, a state machine, or an internal controller as well) 19 controls the operation of each of the circuits BK, 11, 12, 13, 15, 16 and 17 within the memory device 1. The control circuit 19 can decode a command CMD from the interface circuit 11. The control circuit 19 operates the circuits BK, 11, 12, 13, 15, 16 and 17 in synchronism with the internal clock CLKi in order to execute the operation sequence indicated by the command CMD.

(1-3) Configuration Example of Bank

A configuration example of the banks BK of the memory device 1 of the present embodiment will be described with reference to FIGS. 4 to 7.

Figure 4:
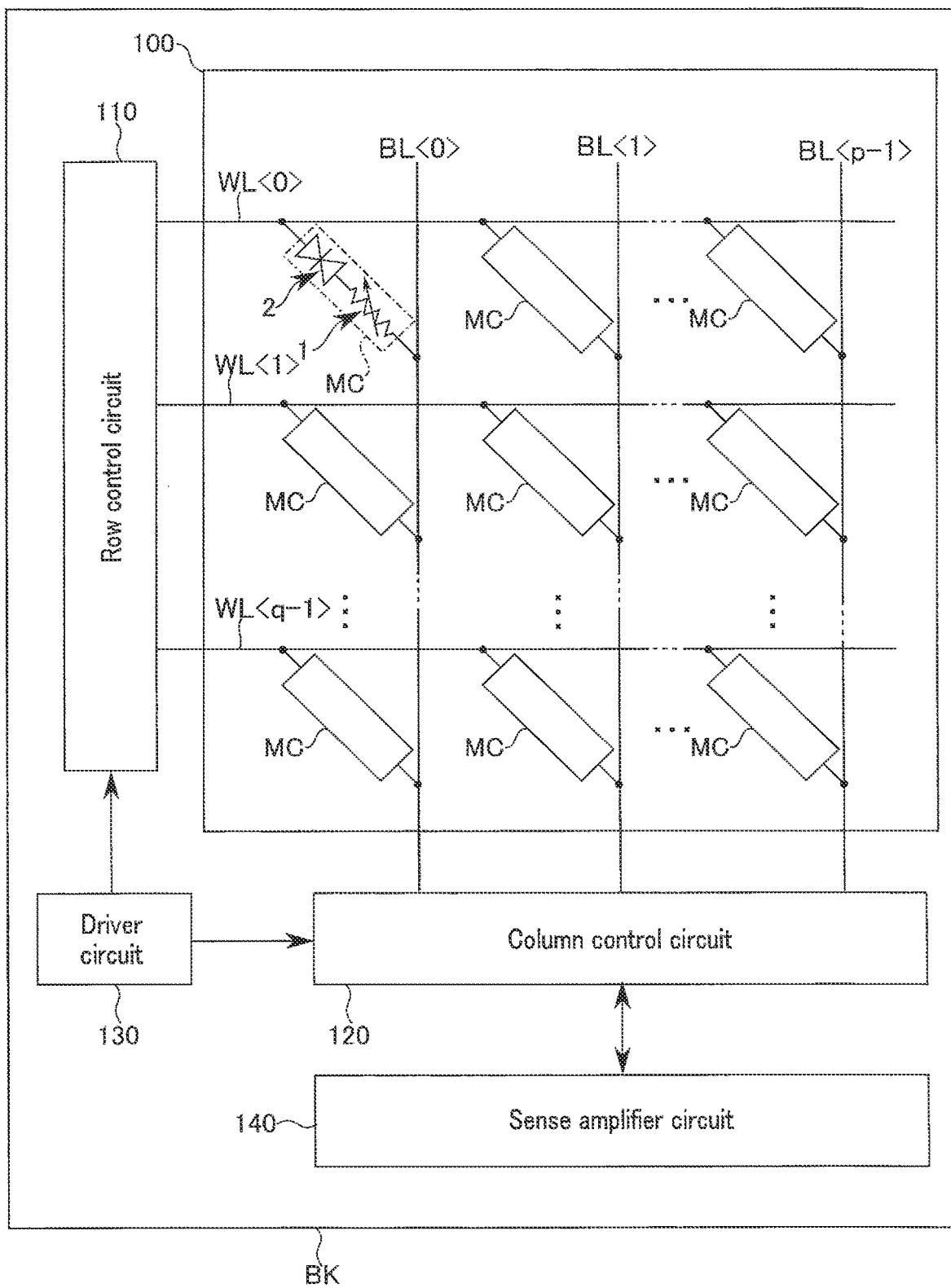
FIG. 4 is a circuit diagram showing a configuration example of the memory device according to the embodiment.

FIG. 4 is a block diagram showing the internal configuration of a certain bank BK of the memory device 1 of the present embodiment.

As shown in FIG. 4, the bank BK includes a memory cell array 100, a row control circuit 110, a column control circuit 120, a driver circuit 130, a sense amplifier circuit 140, etc.

A plurality of memory cells MC are arranged in the memory cell array 100 in a matrix pattern. Each memory cell MC is provided between one bit line BL and one word line WL. Each memory cell MC is coupled to the corresponding one of a plurality of bit lines BL (BL<0>, BL<1>, ..., BL<p−1>) and the corresponding one of a plurality of word lines WL (WL<0>, WL<1>, ..., WL<q−1>). Here, p and q are integers of 2 or more.

Each memory cell MC includes a memory element 20 and a selector 30.

The memory element 20 is, for example, a variable resistance element. The resistance state of the memory element 20 changes to one of a plurality of resistance states (e.g., a low resistance state and a high resistance state) according to the supplied voltage (or current). The memory element 20 can store data by associating the resistance state of the element 20 with data (e.g., "0" data and "1" data).

The selector 30 functions as a selection element (switching element) of the memory cells MC. The selector 30 has a function of controlling the supply of a current (or a voltage) to the memory element 20 when data is written to the corresponding memory element 20 and when data is read from the corresponding memory element 20. For example, the selector 30 can supply a current to the memory element 20 in the direction from the bit line BL to the word line WL and in the direction from the word line WL to the bit line BL.

For example, the selector 30 is a two-terminal switching element. The selector 30 will be hereinafter referred to as a switching element 30. Where the voltage applied between the two terminals of the switching element 30 is less than the threshold voltage of the switching element 30, the switching element 30 is set to the OFF state (the high resistance state or the electrically non-conducting state). Where the voltage applied between the two terminals of the switching element 30 is equal to or higher than the threshold voltage of the switching element 30, the switching element 30 is set to the ON state (the low resistance state or the electrically conducting state). The two-terminal switching element 30 may have the above function regardless of the polarity of the applied voltage (for example, the positive polarity or the negative polarity).

The switching element 30 can switch between a state in which a current is supplied to the memory cell MC according to the magnitude of the voltage applied to the memory cell MC and a state in which no current is supplied thereto, and this is enabled regardless of the polarity of the voltage applied to the memory cell MC (the direction of the current flowing through the memory cell MC).

The structure of the memory cell array 100 will be described later.

The row control circuit 110 controls the rows of the memory cell array 100. The row control circuit 110 selects a row (a word line WL) in the memory cell array 100, based on a decode signal supplied from the row decoder 12. The row control circuit 110 can control selected word lines WL and unselected word lines WL.

For example, the row control circuit 110 includes a row switch circuit (a word line switch circuit).

The column control circuit 120 controls the columns of the memory cell array 100. The column control circuit 120 selects a column (a bit line BL) in the memory cell array 100, based on a decode signal from the column decoder 13. The column control circuit 120 can control selected bit lines BL and unselected bit lines BL.

For example, the column control circuit 120 includes a column switch circuit (a bit line switch circuit).

The driver circuit 130 supplies either a voltage supplied from the voltage generation circuit 15 or a current generated using the supplied voltage to the memory cell array 100, via the row control circuit 110 and the column control circuit 120.

During a write sequence, the driver circuit 130 applies a write current (or a write voltage) for data write to one or more memory cells MC, which correspond to the selected address ADR in the memory cell array 100, via the row control circuit 110 and the column control circuit 120.

For example, the driver circuit 130 includes a write driver (not shown) for generating a write current (or a write voltage). The write driver has a current source (or a voltage source) and a current sink (or a ground terminal).

During a read sequence, the driver circuit 130 supplies a read current (or a read voltage) for data read to one or more memory cells MC, which correspond to the selected address ADR in the memory cell array 100, via the row control circuit 110 and the column control circuit 120.

For example, the driver circuit 130 includes a read driver (not shown) for generating a read current (or a read voltage). The read driver has a current source (or a voltage source) and a current sink (or a ground terminal).

The driver circuit 130 supplies a non-selection voltage to the unselected word lines WL and unselected bit lines BL in the memory cell array 100 via the row control circuit 110 and the column control circuit 120.

In the description below, a memory cell MC corresponding to a selected address ADR (i.e., a memory cell coupled to a selected word line WL and a selected bit line BL) will be referred to as a selected cell.

In the description below, memory cells MC coupled to unselected word lines WL and memory cells MC coupled to unselected bit lines BL (i.e., memory cells other than the selected cells) will be referred to as unselected cells.

The sense amplifier circuit 140 senses and amplifies a signal output from the memory cell array 100 during the read sequence.

For example, the sense amplifier circuit 140 senses the potential of the bit line BL or the current flowing through the bit line BL during the read sequence. The sense amplifier circuit 140 amplifies a signal corresponding to the sensing result. The sense amplifier circuit 140 determines data stored in memory cell MC, based on the amplified signal. The determined result is read from the memory device 1 as read data.

It should be noted that the sense amplifier circuit 140 may have a function (a latch circuit) for temporarily holding write data.

The bank BK operates the circuits 100, 110, 120, 130 and 140 described above, under the control of the control circuit 19.

(Structural Example of Memory Cell Array)

A description will be given of how a structural example of the memory cell array 100 is in the memory device 1 of the present embodiment, with reference to FIGS. 5 to 7.

Figure 5:
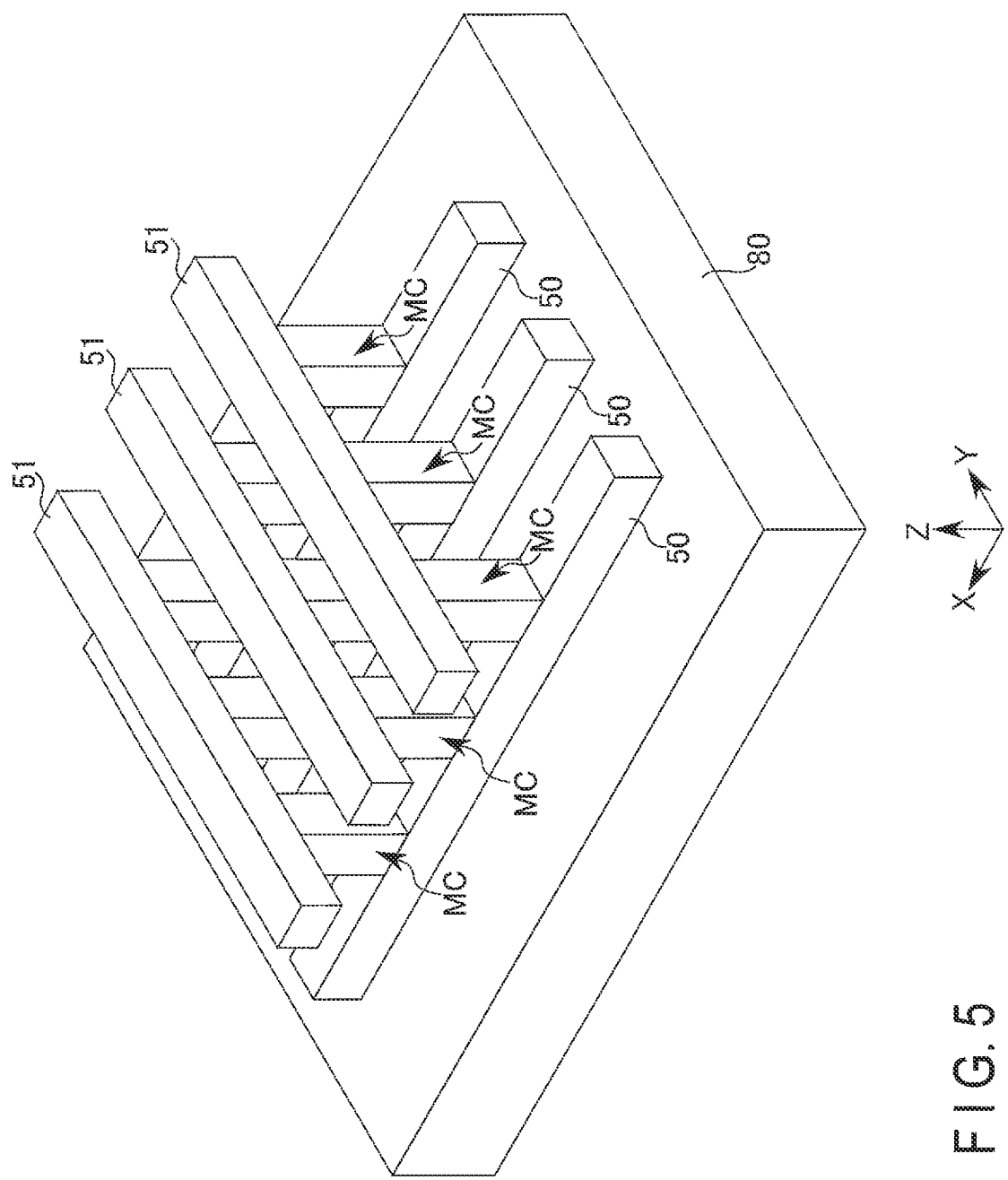
FIG. 5 is a bird's-eye view showing a structural example of the memory device according to the embodiment.
Figure 6:
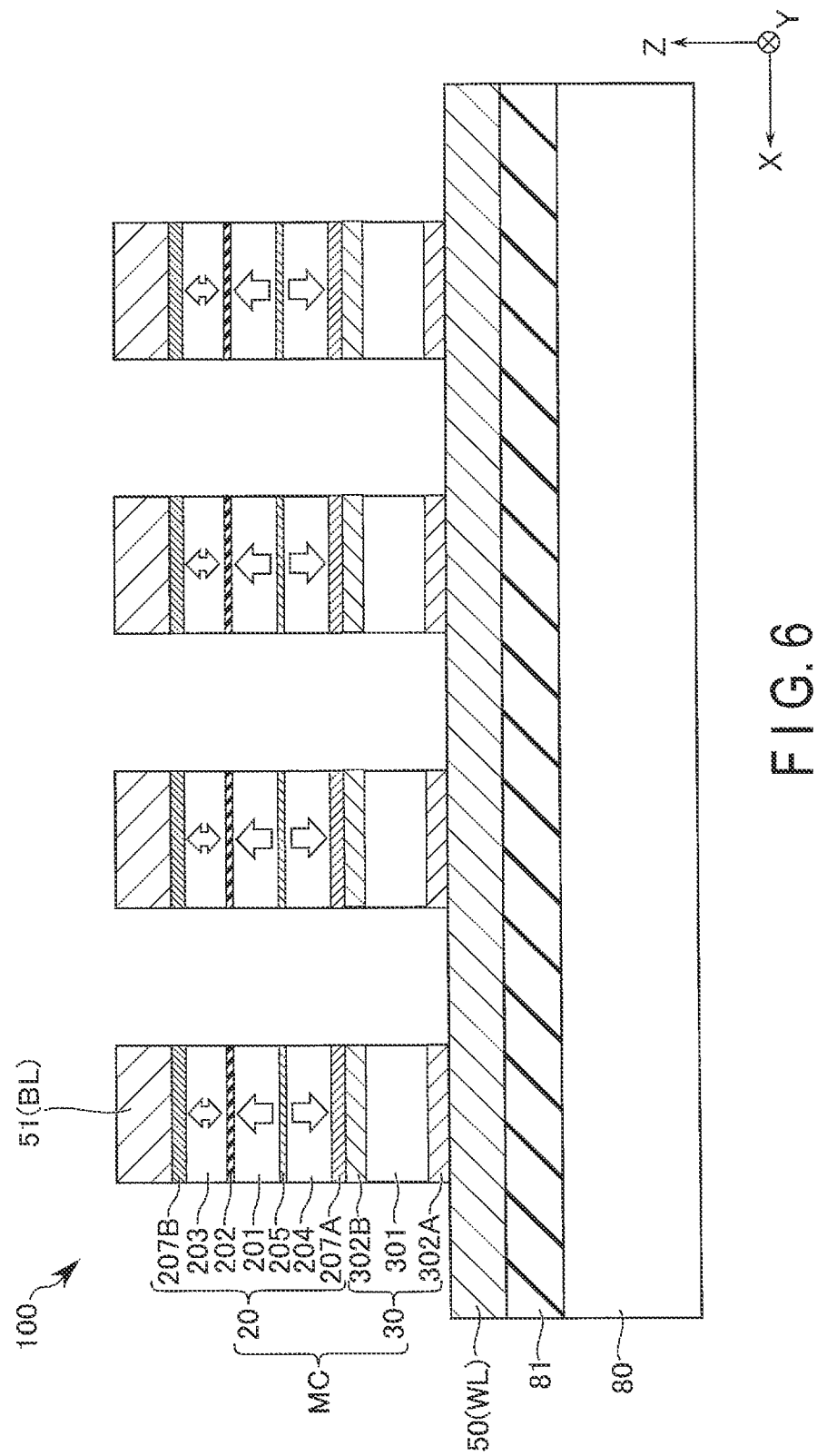
FIG. 6 is a cross-sectional view showing a structural example of the memory device according to the embodiment.
Figure 7:
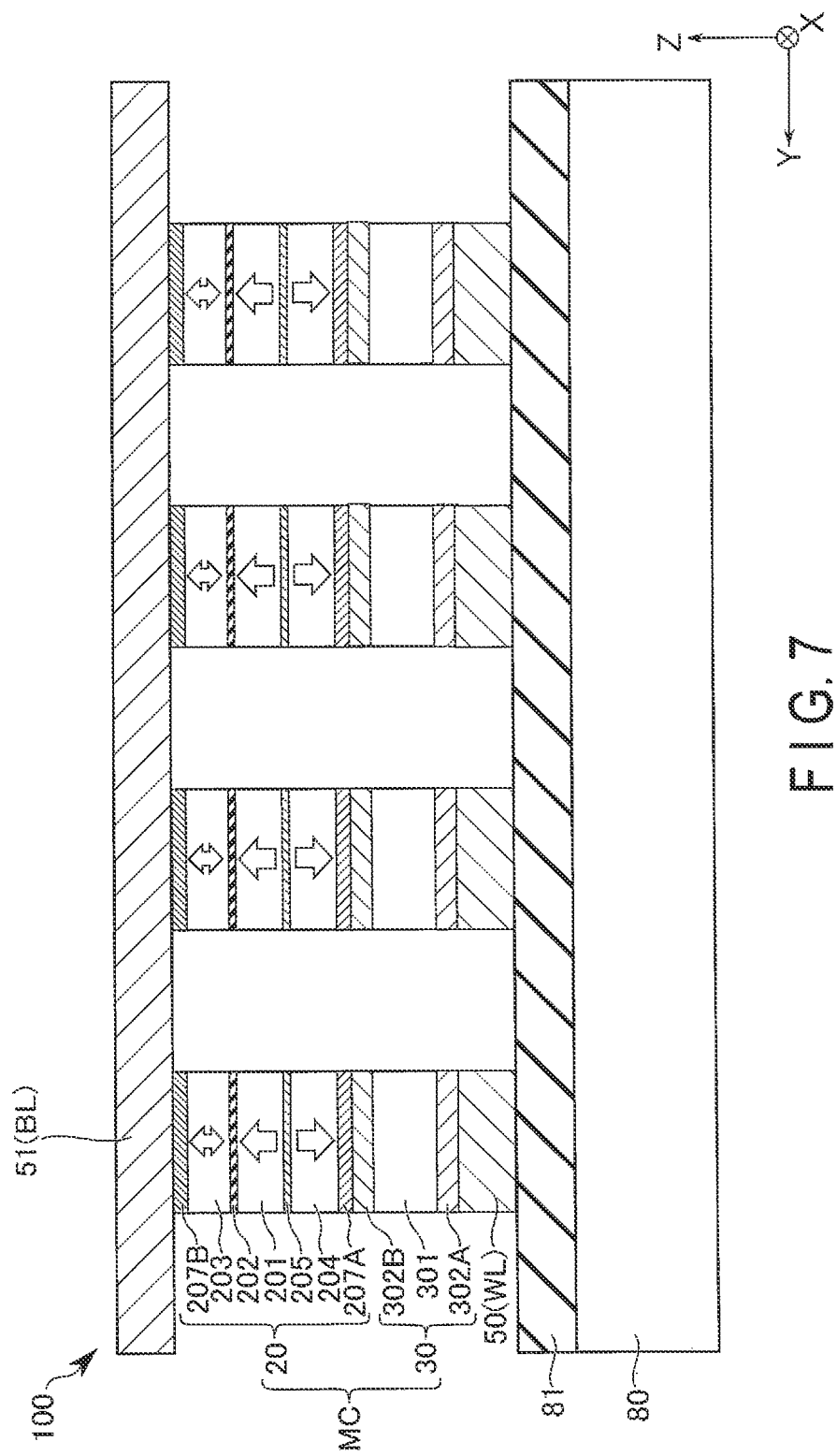
FIG. 7 is a cross-sectional view showing a structural example of the memory device according to the embodiment.

FIGS. 5 to 7 are diagrams for illustrating how the structural example of the memory cell array 100 is in the memory device 1 of the present embodiment. FIG. 5 is a bird's-eye view for illustrating the structural example of the memory cell array 100. FIG. 6 is a schematic cross-sectional view showing a cross-sectional structure taken along the X direction (X axis) of the memory cell array 100. FIG. 7 is a schematic cross-sectional view showing a cross-sectional structure taken along the Y direction (Y-axis) of the memory cell array 100.

As shown in FIGS. 5 to 7, the memory cell array 100 is provided above the upper surface of a substrate 80.

The X direction is a direction parallel to the upper surface of the substrate 80. The Y direction is parallel to the upper surface of the substrate 80 and intersecting the X direction. In the description below, a plane parallel to the upper surface of the substrate 80 will be referred to as an X-Y plane. The direction (axis) perpendicular to the X-Y plane will be referred to as a Z direction (Z axis). A plane parallel to the plane formed by the X and Z directions will be referred as an X-Z plane. A plane parallel to the plane formed by the Y and Z directions will be referred to as a Y-Z plane.

The memory cell array 100 has a structure in which a plurality of layers are stacked, for example, in the Z direction.

A plurality of interconnects (conductive layers) 50 are provided above the upper surface of the substrate 80 in the Z direction, such that an insulating layer 81 on the substrate 80 is interposed. A plurality of interconnects 50 are arranged along the Y direction. Each interconnect 50 extends along the X direction. Each of the plurality of interconnects 50 functions, for example, as a word line WL.

A plurality of interconnects (conductive layers) 51 are provided above the plurality of interconnects 50, in the Z direction. The plurality of interconnects 51 are arranged along the X direction. Each interconnect 51 extends along the Y direction. Each of the plurality of interconnects 51 functions, for example, as a bit line BL.

A plurality of memory cells MC are provided between the plurality of interconnects 50 and the plurality of interconnects 51. The plurality of memory cells MC are arranged in the X-Y plane in a matrix pattern.

The plurality of memory cells MC aligned in the X direction are provided on one interconnect 50 in the Z direction. The plurality of memory cells MC aligned in the X direction are coupled to a common word line WL.

The plurality of memory cells MC aligned in the Y direction are provided under one interconnect 51 in the Z direction. The plurality of memory cells MC aligned in the Y direction are coupled to a common bit line BL.

The memory cell array 100 is covered with an insulating layer (not shown). For example, the insulating layer is provided in the spaces between the memory cells MC, in the spaces between the interconnects 50 and in the spaces between the interconnects 51.

When the memory cell array 100 has such a circuit configuration as shown in FIG. 4, the switching element 30 is provided below the memory element 20 in the Z direction. The switching element 30 is provided between the memory element 20 and the interconnect 50. The memory element 20 is provided between the interconnect 51 and the switching element 30.

Thus, in the stacked-type memory cell array 100, each memory cell MC is a stack made up of the memory element 20 and the switching element 30.

FIGS. 6 and 7 show an example in which the insulating layer 81 is provided between the plurality of interconnects 50 and the substrate 80. When the substrate 80 is a semiconductor substrate, one or more field effect transistors (not shown) may be provided on a semiconductor region on the upper surface of the substrate 80. The field effect transistors are covered with the insulating layer 81. The field effect transistors on the substrate 80 are components of a peripheral circuit PERI within the memory device 1. Thus, a circuit for controlling the operation of the memory cell array 100 may be provided below memory cell array 100 in the Z direction. Incidentally, when the substrate 80 is an insulating substrate, the plurality of interconnects 50 may be provided directly on the upper surface of the substrate 80, without the insulating layer 81.

The circuit configuration and structure of the stacked-type memory cell array 100 are not limited to the examples shown in FIGS. 4 to 7. The circuit configuration and structure of the memory cell array 100 can be appropriately modified in accordance with a connection relationship of the memory elements 20 and switching elements 30 to the bit lines BL and word lines WL.

(Structural Example of Memory Cell Array)

The internal structure of the memory cell MC will be described with reference to FIGS. 6 and 7.

The switching element 30 has the configuration described below.

As shown in FIGS. 6 and 7, the switching element 30 includes at least a variable resistance layer (also referred to as a selector layer or a switch layer) 301 and two electrodes 302 (302A, 302B). The variable resistance layer 301 is provided between the two electrodes (conductive layers) 302A and 302B in the Z direction.

In the examples shown in FIGS. 6 and 7, the electrode 302A (hereinafter referred to as a lower electrode as well) is provided below the variable resistance layer 301 in the Z direction, and the electrode 302B (also referred to as an upper electrode as well) is provided above the variable resistance layer 301 in the Z direction. For example, the electrode 302A is provided between the interconnect 50 and the variable resistance layer 301. The electrode 302B is provided between the variable resistance layer 301 and the memory element 20. The switching element 30 is coupled to the interconnect 50 via the electrode 302A. The switching element 30 is coupled to the memory element 20 via the electrode 302B.

The resistance state (the resistance value) of the variable resistance layer 301 changes. The variable resistance layer 301 can have a plurality of resistance states.

Depending on the voltage applied to the switching element 30 (the memory cell MC), the resistance state of the variable resistance layer 300 is set to a high resistance state (a non-conducting state) or a low resistance state (a conducting state). When the resistance state of the variable resistance layer 301 is in the high resistance state, the switching element 30 is off. When the resistance state of the variable resistance layer 301 is in the low resistance state, the switching element 30 is on.

When the memory cell MC is set in the selected state, the switching element 30 is turned on, so that the resistance state of the variable resistance layer 301 is in the low resistance state. In this case, the switching element 30 permits a current (or a voltage) to be supplied to the memory element 20. When the memory cell MC is set in the unselected state, the switching element 30 is turned off, so that the resistance state of the variable resistance layer 301 is in the high resistance state. In this case, the switching element 30 cuts off the supply of a current (or a voltage) to the memory element 20.

Depending on the material of the variable resistance layer 301, the change in the resistance state of the variable resistance layer 301 may depend on the current (e.g., the magnitude of the current) flowing through the switching element 30.

The variable resistance layer 301 of the switching element 30 includes at least one kind of element selected from the group consisting of boron (B), aluminum (Al), gallium (Ga), indium (In), carbon (C), silicon (Si), germanium (Ge), tin (Sn), arsenic (As), phosphorus (P) and antimony (Sb).

The switching element 30 may include, for example, an insulator including a dopant (impurities) in the variable resistance layer 301. The dopant added to the insulator is impurities that contribute to electrical conduction of the insulator. An example of an insulator used for the variable resistance layer 301 of the switching element 30 is silicon oxide. When the material of the variable resistance layer 301 is silicon oxide, for example, phosphorus or arsenic is used as a dopant added to the silicon oxide. It should be noted that the kind of dopant added to the silicon oxide of the variable resistance layer 301 is not limited to the above example. Likewise, the switching element 30 may be made of a material having snapback characteristics.

The memory element 20 has a configuration described below.

When the memory device 1 is an MRAM, the memory element 20 is a magnetoresistive effect element 20.

As shown in FIGS. 6 and 7, the magnetoresistive effect element 20 includes two magnetic layers 201 and 203 and a non-magnetic layer 202. The non-magnetic layer 202 is provided between the two magnetic layers 201 and 203 in the Z direction. In the example shown in FIGS. 5 and 6, a plurality of layers 201, 202 and 203, that is, a magnetic layer 201, a non-magnetic layer 202 and a magnetic layer 203, are disposed in this order in the Z direction from the side of the interconnect 50 (e.g., a word line WL) toward the interconnect 51 (e.g., a bit line BL).

The two magnetic layers 201 and 203 and the non-magnetic layer 202 form a magnetic tunnel junction. In the description below, the magnetoresistive effect element 20 including the magnetic tunnel junction will be referred to as an MTJ element 20. The non-magnetic layer 202 of the MTJ element 20 will be referred to as a tunnel barrier layer.

Each of the magnetic layers 201 and 203 is, for example, a ferromagnetic layer including at least one element selected from cobalt (Co), iron (Fe) and nickel (Ni). The magnetic layers 201 and 203 may further include boron (B). More specifically, for example, the magnetic layers 201 and 203 include cobalt iron boron (CoFeB) or iron boride (FeB). The magnetic layers 201 and 203 may be single-layer films (e.g., alloy films) or multi-layer films (e.g., artificial lattice films).

The tunnel barrier layer 202 is, for example, an insulating layer (e.g., a magnesium oxide layer) including oxygen (O) and magnesium (Mg). The tunnel barrier layer 202 may be a single-layer film or a multi-layer film. It should be noted that the tunnel barrier layer 202 may further include an element other than oxygen and magnesium.

In the present embodiment, the MTJ element 20 is a magnetoresistive effect element of perpendicular magnetization type.

For example, each of the magnetic layers 201 and 203 has perpendicular magnetic anisotropy. Each of the magnetic layers 201 and 203 has magnetization perpendicular to the layer planes of the magnetic layers 201 and 203.

Of the two magnetic layers 201 and 203, one magnetic layer is a layer in which the magnetization direction is variable, and the other magnetic layer is a layer in which the magnetization direction is invariable. The MTJ element 20 can have a plurality of resistance states (resistance values) in accordance with the relative relationship (magnetization arrangement) between the magnetization direction of one magnetic layer and the magnetization direction of the other magnetic layer.

In the examples shown in FIGS. 6 and 7, the magnetization direction of the magnetic layer 203 is variable. The magnetization direction of the magnetic layer 201 is invariable (fixed state). The magnetic layer 203 whose magnetization direction is variable will be hereinafter referred to as a storage layer. The magnetic layer 201 whose magnetization direction is invariable will be hereinafter referred to as a reference layer. It should be noted that the storage layer 203 may also be referred to as a free layer, a magnetization free layer or a magnetization variable layer. The reference layer 201 may also be referred to as a pin layer, a pinned layer, a magnetization invariant layer or a magnetization fixed layer.

In the present embodiment, the expression "the magnetization direction of the reference layer (the magnetic layer) is invariable" or "the magnetization direction of the reference layer (the magnetic layer) is fixed" means that the magnetization direction of the reference layer 201 does not change before and after a current (or a voltage) is supplied to the MTJ element 20 to change the magnetization direction of the storage layer 203.

When the magnetization direction of the storage layer 203 is the same as that of the reference layer 201 (when the magnetization alignment state of the MTJ element 20 is in the parallel alignment state), the resistance state of the MTJ element 20 is in a first resistance state. When the magnetization direction of the storage layer 203 is different from that of the reference layer 201 (when the magnetization alignment state of the MTJ element 20 is in the antiparallel alignment state), the resistance state of the MTJ element 20 is in a second resistance state different from the first resistance state. For example, the resistance value of the MTJ element 20 in the second resistance state (in the antiparallel arrangement state) is higher than the resistance value of the MTJ element 20 in the first resistance state (in the parallel arrangement state).

In the description below, with respect to the magnetization arrangement state of the MTJ element 20, the parallel arrangement state will also be referred to as a P (Parallel) state, and the anti-parallel arrangement state will also be referred to as an AP (Anti-parallel) state.

In accordance with the circuit configuration of the memory cell array 100, there may be a case where the reference layer is provided above the tunnel barrier layer 202 in the Z direction, and the storage layer is provided below the tunnel barrier layer 202 as viewed in the Z direction.

For example, the MTJ element 20 includes conductive layers (electrodes) 207A and 207B. The magnetic layers 201 and 203 and the tunnel barrier layer 202 are provided between the two conductive layers 207A and 207B in the Z direction. Incidentally, the conductive layer 207A and the electrode 302B may be replaced with one continuous conductor.

For example, a shift cancel layer 204 may be provided in the MTJ element 20. In this case, the shift cancel layer 204 is provided between the reference layer 201 and the conductive layer 207A. The shift cancel layer 204 is a magnetic layer for relieving the adverse effect of the stray field of the reference layer 201. When the MTJ element 20 includes the shift cancel layer 204, a non-magnetic layer 205 is provided between the shift cancel layer 204 and the reference layer 201. The non-magnetic layer 205 is, for example, a metal layer such as a ruthenium layer. The shift cancel layer 204 is coupled to the reference layer 201 anti-ferromagnetically through the non-magnetic layer 205. Thus, the stack including the reference layer 201 and the shift cancel layer 204 forms an SAF (synthetic anti-ferromagnetic) structure. In the SAF structure, the magnetization direction of the shift cancel layer 204 is opposite to that of the reference layer 201. The SAF structure allows the magnetization direction of the reference layer 201 to be fixed more stably. A set made up of the two magnetic layers 201 and 204 and one non-magnetic layer 205 forming the SAF structure may be referred to as a reference layer.

For example, a non-magnetic layer (not shown) referred to as an underlayer may be provided between the shift cancel layer 204 and the conductive layer 207A. The underlayer is a layer for improving the properties (e.g., the crystalline property and the magnetic property) of the magnetic layer that is in contact with the underlayer (in this example, the shift cancel layer 204). For example, a non-magnetic layer (not shown) referred to as a cap layer may be provided between the storage layer 203 and the conductive layer 207B. The cap layer is a layer for improving the properties (e.g., the crystalline property and the magnetic property) of the magnetic layer that is in contact with the cap layer (in this example, the storage layer 203).

The memory device 1 and memory module MM of the present embodiment execute a write operation for wear leveling processing during a read sequence, by performing an operation (control method) described later.

For example, the controller 2 holds a management table TBL for wear leveling processing.

The wear leveling processing is a technique for distributing addresses of data write targets as uniformly as possible so that data write does not concentrate on a specific address. Thus, the number of times data is written to a plurality of memory cells MC within the memory space can be smoothed (averaged). As a result, the lives of the memory device 1 and the memory module MM can be made longer.

By executing the wear leveling processing during the read sequence, the operation period of the memory device 1 and the memory module MM of the present embodiment can be shortened.

Accordingly, the memory device 1 and the memory module MM of the present embodiment can improve the operating characteristics of memory devices.

(2) Operation Example

An operation example of the memory device 1 and memory module MM of the present embodiment will be described with reference to FIGS. 8 to 12. The operation example of the memory device 1 of the present embodiment includes a control method of memory devices. The operation example of the memory module (memory system) MM of the present embodiment includes a control method of memory modules.

A description will be given of how a read sequence is executed in the memory device 1 and the memory module MM of the present embodiment.

In the present embodiment, the read sequence of the memory device 1, which includes an MRAM, is performed using self-reference read.

It should be noted that the write sequence of the memory device 1 and memory module MM of the present embodiment is executed by a known technique. Therefore, the description of how the write sequence is performed in the memory device 1 will be omitted in connection with the preset embodiment.

For example, when the memory device 1 of the present embodiment is an MRAM, the write sequence is executed by an STT (Spin torque transfer) method.

(2-1) Self-Reference Read

The self-reference read executed in the read sequence of the memory device 1 of the present embodiment will be described with reference to FIGS. 8 and 9.

FIG. 8 is a flowchart of the self-reference read performed in the read sequence of the memory device 1 of the present embodiment. FIG. 9 is a schematic diagram for illustrating how the self-reference read is executed in the read sequence of the memory device of the present embodiment.

S1

In a read sequence using the self-reference read, the memory device 1 performs a first read operation, based on the supplied read command CMD and address ADR. The first read operation is also referred to as first data read, cell data read, or a first sense operation.

Based on the address ADR, the memory cell MC-S that stores certain data (cell data) in the bank BK is selected as a data read target (a selected cell).

In the first read operation of the read sequence, the driver circuit 130 applies a selection voltage to a selected cell MC-S. For example, the driver circuit 130 applies a positive voltage to the selected bit line BL and applies a voltage of 0V (ground voltage) to the selected word line WL.

The selection voltage turns on the switching element 30 of the selected cell MC-S.

Figure 9:
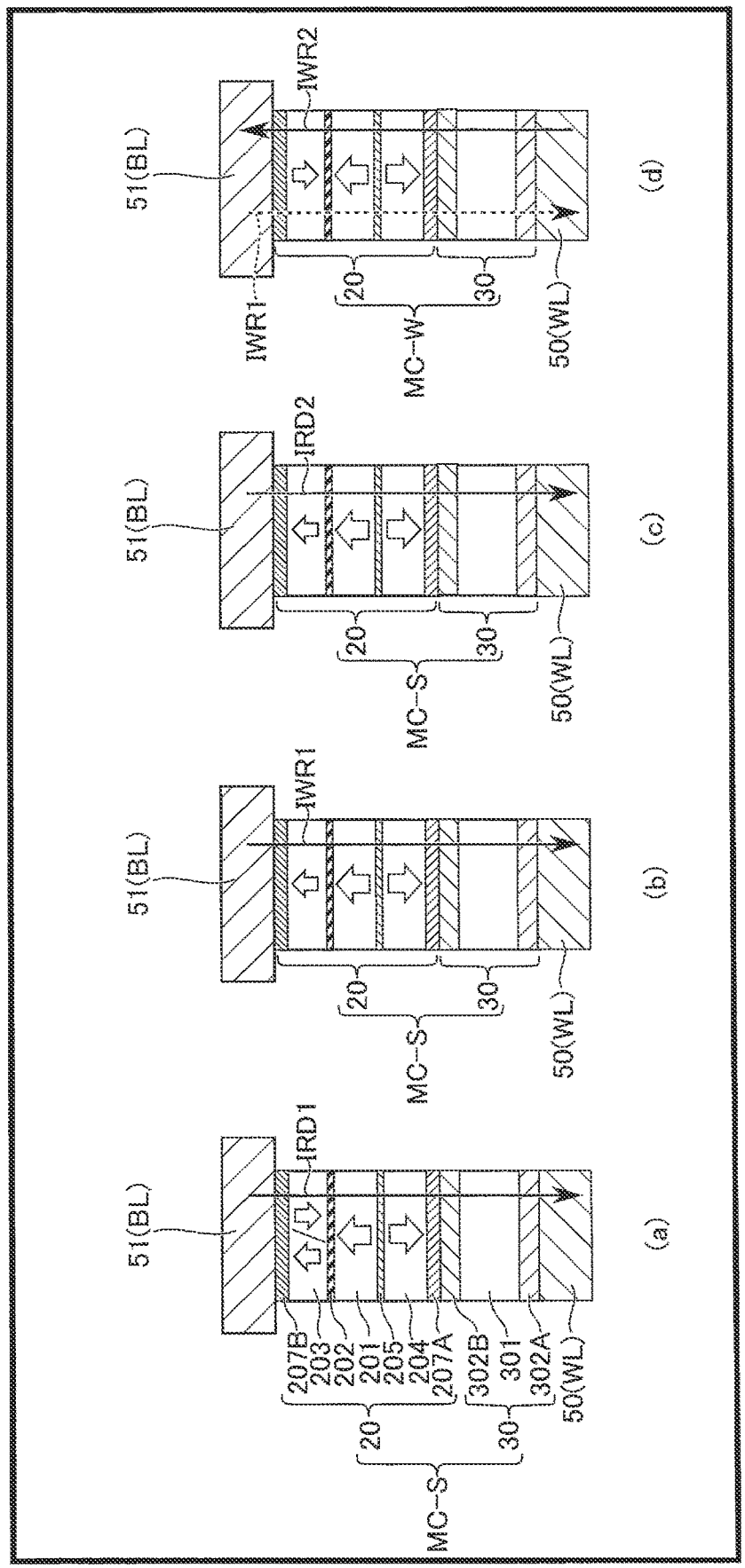
FIG. 9 is a diagram showing an operation example of the memory device according to the embodiment.

Thus, as shown in (a) of FIG. 9, a read current IRD1 flows through the selected cell MC-S from the selected bit line BL toward the selected word line WL. In the MTJ element 20, the read current IRD1 flows, for example, from the storage layer 203 to the reference layer 201.

The sense amplifier circuit 140 senses the potential of the bit line BL (or the current value of the current flowing through the bit line BL) at a certain point of time. Thus, the sense amplifier circuit 140 acquires a sense signal that is output from the selected cell MC-S in the first read operation.

The potential which the bit line BL has at a certain point when the resistance state of the MTJ element 20 is in the low resistance state (when the MTJ element 20 is in the P state) differs from the potential which the bit line BL has at the certain point when the resistance state of the MTJ element 20 is in the high resistance state (when the MTJ element 20 is in the AP state). Therefore, the potential (sense signal) of the bit line BL sensed by the sense amplifier circuit 140 differs in accordance with the data stored in the MTJ element 20.

In the first read operation, a non-selection voltage is applied to unselected cells coupled to unselected word lines or unselected bit lines.

S2

In a read sequence using self-reference read, the memory device 1 performs a reset operation for the selected cell after the first read operation. A reset operation is an operation of writing reference data to the selected cell. The reset operation is also referred to as reference data write or reset write.

As shown in (b) of FIG. 9, in the reference data write operation, the driver circuit 130 causes a write current IWR1 to flow through the selected cell MC-S.

For example, when the reference data is "0" data, the write current IWR1 flows through the selected cell MC-S from the selected bit line BL (the storage layer 203 of the MTJ element 20) toward the selected word line WL (the reference layer 201 of the MTJ element 20).

It should be noted that the direction in which the write current IWR1 flows when "0" data is written changes depending on the circuit configuration of the memory cell array 100.

By the supply of the write current IWR1, "0" data is written to the selected cell MC-S. The selected cell MC-S is set to a reset state (a "0" data-holding state) in the self-reference read.

During the reset operation, a non-selection voltage is applied to unselected cells coupled to unselected word lines or unselected bit lines.

S3

In a read sequence using self-reference read, the memory device 1 performs a second read operation for the selected cell MC-S in the reset state after the reference data is written to the selected cell MC-S. The second read operation is also referred to as second data read, reference data read, or a second sense operation.

In the second read operation, the driver circuit 130 applies a selection voltage to the selected cell MC-S substantially in the same manner as in the first read operation.

Thus, as shown in (c) of FIG. 9, a read current IRD2 flows from the bit line BL to the word line WL via the selected cell MC-S. Thus, the direction in which the read current IRD2 (and the read current IRD1) flows in the selected cell MC-S is the same as the direction in which the write current IWR1 flows in the selected cell MC-S.

The sense amplifier circuit 140 senses a potential of bit line BL at a certain point of time. Thus, the sense amplifier circuit 140 acquires a sense signal (which may hereinafter be referred to as a reference signal) that is output from the selected cell MC-S of the reset state in the second read operation.

In the second read operation, a non-selection voltage is applied to unselected cells coupled to unselected word lines or unselected bit lines.

S4

The memory device 1 determines the data of the selected cell MC-S, based on the sense result (the sense signal) of the first read operation and the sense result (the sense signal) of the second read operation.

For example, the memory device 1 compares the sense signal of the first read operation and the sense signal of the second read operation with each other.

For example, when the difference between the two sense signals is equal to or less than a certain threshold, the sense amplifier circuit 140 determines that the data in the selected cell MC-S is first data (e.g., "0" data). The sense amplifier circuit 140 outputs a signal indicating the first data.

On the other hand, when the difference between the two sense signals is greater than the certain threshold, the sense amplifier circuit 140 determines that the data in the selected cell MC-S is second data (e.g., "1" data) different from the first data. The sense amplifier circuit 140 outputs a signal indicating the second data.

Thus, the data in the selected cell MC-S is determined based on the two sense signals obtained in the first and second read operations.

The determined data is output to the bank buffer circuit 17 as read data from the selected cell MC-S.

S5

In the self-reference read, the cell data in a memory cell MC is destroyed when reference data is written thereto after the first read operation.

To restore the destroyed cell data, therefore, a data write-back operation is performed.

In a read sequence using self-reference read, the memory device 1 performs a write-back operation to write the read data to the memory cell MC-W as cell data before the destruction of the read data.

The driver circuit 130 controls the potentials of the bit lines BL and word lines WL.

Thus, a write current IWR (IWR1, IWR2) for the write-back operation flows through the memory cell MC-W of the write-back operation target, as shown in (d) of FIG. 9.

The direction in which the write current IWR flows through the memory cell MC-W depends on what data is written to the memory cell MC-W. For example, where "0" data is written to the memory cell MC, a write current IWR1 flowing from the bit line BL (the storage layer 203 of the MTJ element 20) to the word line WL (the reference layer 201 of the MTJ element) is supplied to the memory cell MC-W, as in the case shown in (c) of FIG. 9. For example, when "1" data is written to the memory cell MC, a write current IWR2 flowing from the word line WL (the reference layer 201 of the MTJ element 20) to the bit line BL (the storage layer 203 of the MTJ element 20) is supplied to the memory cell MC-W.

When the value of the cell data is the same as that of the reference data, the write current IWR1 for writing "0" data in the write-back operation may not be supplied to the memory cell MC-W.

In the present embodiment, the write-back operation is performed for the memory cells MC-W different from a memory cell MC-S for the data read target. For example, the bank BK including the memory cell MC-W for the write-back operation target is different from the bank BK including the memory cell MC-S for the data read target.

In the description below, the bank including the memory cell MC-S for data read target may be referred to as a read bank as well. In the description below, the bank including the memory cell MC-W for the write-back operation target may be referred to as a write bank or a write-back bank.

Thus, the memory device 1 of the present embodiment can copy data for wear leveling processing by performing the write-back operation in the self-reference read.

In this manner, in the memory device 1 of the present embodiment, the wear leveling processing is included in the read sequence because it is made common to the write-back operation.

In the memory device 1 of the present embodiment, the wear leveling processing can be regarded as being continuous with or parallel to the self-reference read (read sequence).

(2-2) Read Sequence

A read sequence of the memory device 1 and the memory module MM of the present embodiment will be described with reference to FIGS. 10 to 12.

Figure 10:
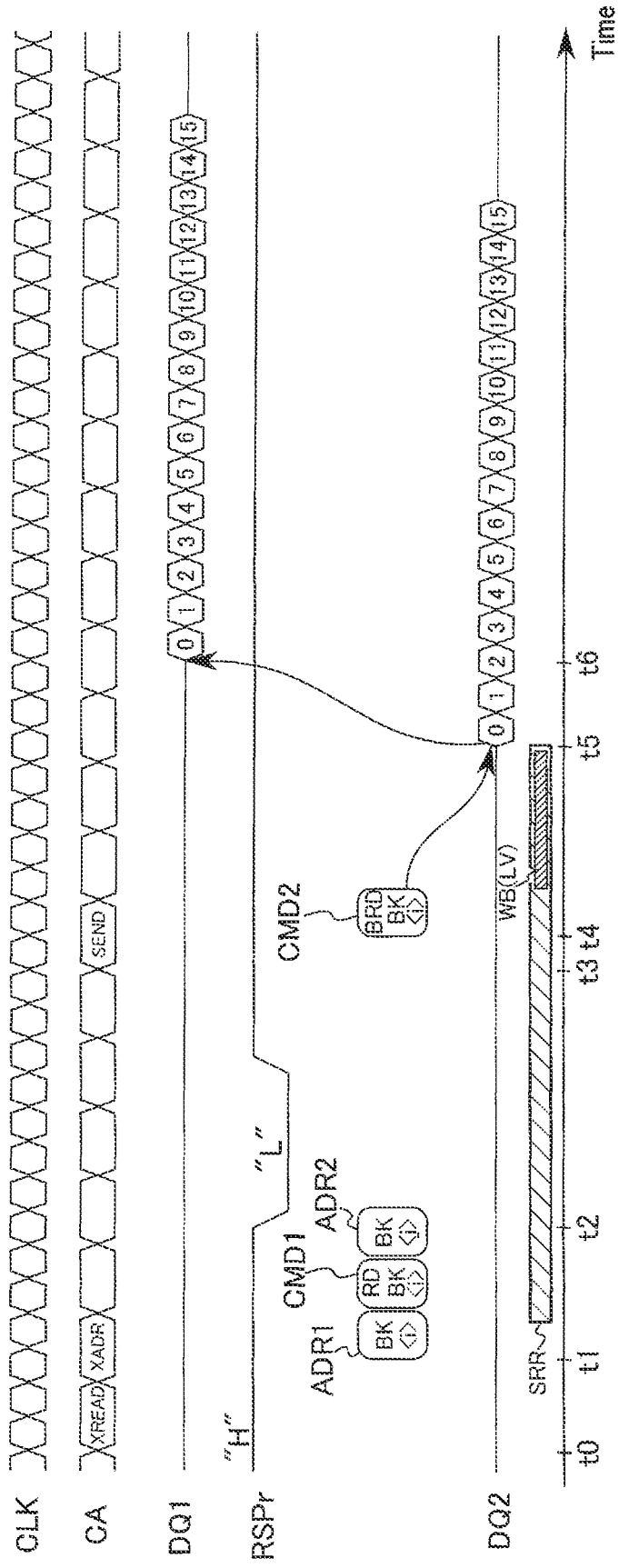
FIG. 10 is a sequence diagram showing an operation example of the memory system and the memory device according to the embodiment.

FIG. 10 is a sequence diagram for illustrating how the read sequence is performed in the memory device 1 of the present embodiment. FIG. 11 is a timing chart for illustrating the read sequence performed in the memory device 1 of the present embodiment. FIG. 11 shows temporal changes of the active state (or in the inactive state) in banks BK<i> and BK<j>, which are operation target banks of the memory device 1, in the read sequence. FIG. 12 is a schematic diagram for illustrating the read sequence of the memory device 1 of the present embodiment. In FIG. 12, how data is moved in the memory device 1 during the read sequence is schematically shown.

<Time t0>

As shown in FIG. 10, the host device 9 commands data read to the memory module MM including the memory device 1 of the present embodiment. At time t0, the host device 9 sends a command XREAD and an address XADR as a command address signal CA to the controller 2 of the memory module MM at a time synchronized with the clock signal CLK.

The controller 2 receives the read command XREAD read from the host device 9 at a time synchronized with the clock signal CLK.

After reception of the command XREAD, the controller 2 receives the address XADR.

Based on the address XADR, the controller 2 generates a read address ADR1 (hereinafter referred to as a selection address as well) for the memory device 1.

The read address ADR1 is address information regarding the bank BK<i> for a data read target. The read address ADR1 includes a bank address, a row address and a column address.

The controller 2 generates a read command (RD) CMD1 for the memory device 1, based on the command XREAD.

The read command CMD1 is a signal set that commands the memory device 1 to execute a read sequence.

<Time t1>

The controller 2 sends the generated read address ADR1 and read command CMD1 to the memory device 1 at time t1.

In the present embodiment, the controller 2 issues an address ADR2 different from the address ADR1 to the memory device 1.

The controller 2 sends the address ADR2 to the memory device 1 in succession to the transmission of the read address ADR1 and the read command CMD1. In the description below, the set made up of the command CMD1 and the address ADR1 (and the address ADR2) will be referred to as a command set.

The address ADR2 is address information relating to a bank BK to which write-back data is to be written. The address ADR2 indicates the write destination address to which the write-back data is to be written in the wear leveling processing. In the description below, the address ADR2 may also be referred to as a write-back address (or a wear-leveling address) ADR2, for the sake of differentiation.

The controller 2 generates the write-back address ADR2, based on a table TBL including management information on the wear leveling. For example, the table TBL includes information representing the number of data write is performed for each bank address, each row address, or each column address.

In the present embodiment, the value of the bank address included in the write-back address ADR2 differs from the value of the bank address included in the read address ADR1.

For example, the row address and column address included in the write-back address ADR2 may be the same as the row address and column address included in the read address ADR1. The row address and column address included in the write-back address ADR2 may be different from the row address and column address included in the read address ADR1.

Based on the number of data writes is performed for each address in the table TBL, the controller 2 designates an address of a bank BK<j> for which data write is not relatively frequently performed as an address to which data is to be written (a data copy destination) in the write-back operation including wear leveling processing.

The address ADR2, which is transmitted (and received) after the transmission of the command CMD1, functions as a trigger signal in response to which a write-back operation including wear leveling processing is performed in the memory device 1.

The memory device 1 receives the read address ADR1 and the read command CMD1 through the interface circuit 11. Thus, the memory device 1 starts an operation sequence in accordance with the self-reference read SRR.

The memory device 1 executes a read sequence, which is based on the read command CMD1, for a plurality of memory cells MC indicated by the read address ADR1. For example, a plurality of memory cells MC corresponding to one page (e.g., 128 bits) of data are selected as read sequence targets.

Each of the row decoder 12 and the column decoder 13 decodes the read address ADR1. The row decoder 12 and the column decoder 13 respectively send a row address decoding result and a column address decoding result to a bank BK<i> indicated by the read address ADR1 (the bank will be hereinafter referred to as a selected bank). Within the selected bank BK<i>, the row control circuit 110 and the column control circuit 120 respectively control the rows and columns of the memory cell array 100, based on the decoding results of the address ADR1.

Thus, a bank BK, a row (one or more word lines WL) of the memory cell array 100, and a column (one or more bit lines BL) of the memory cell array 100 are selected.

<Time t10>

Figure 11:
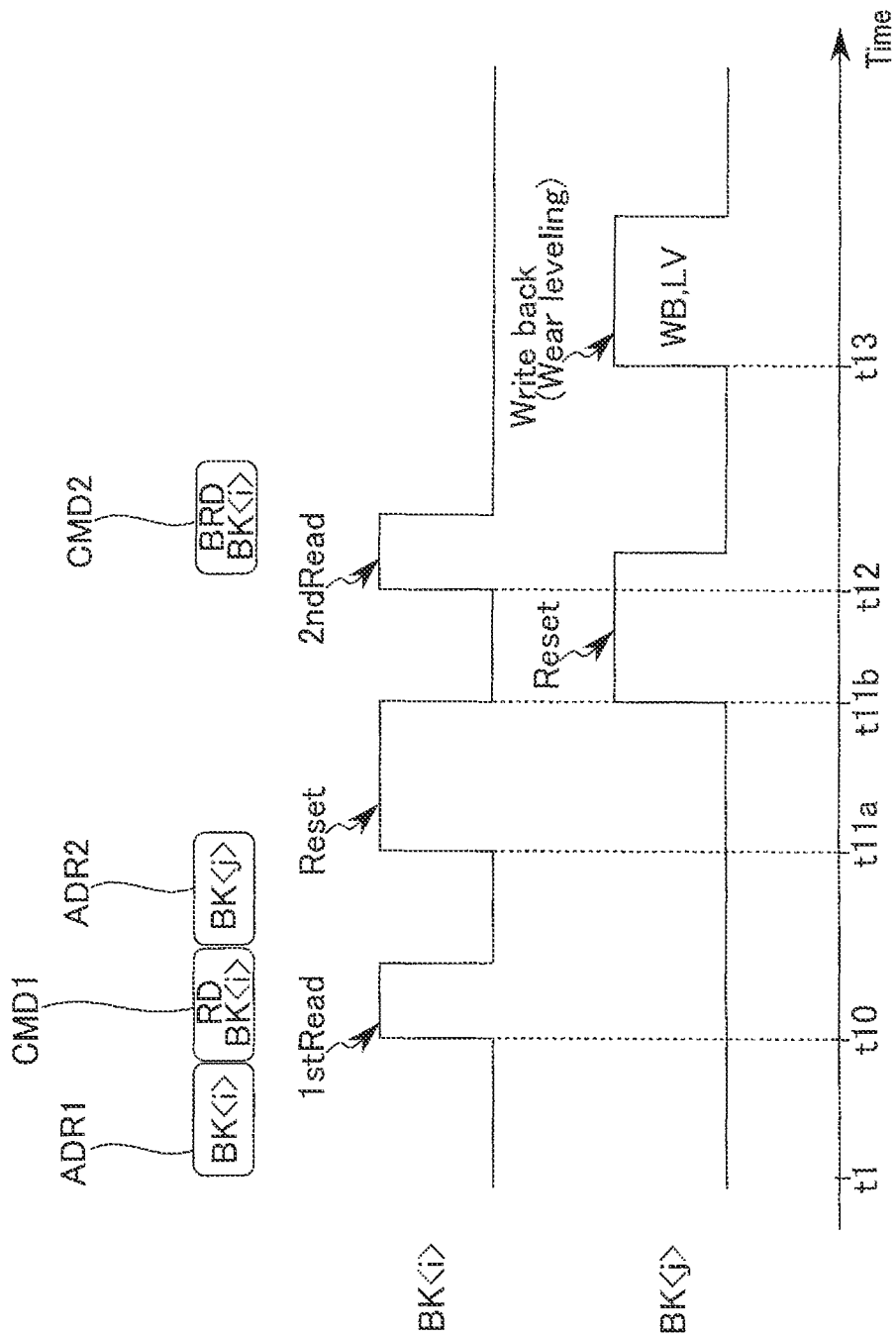
FIG. 11 is a timing chart showing an operation example of the memory device according to the embodiment.

As shown in FIG. 11, at time t10, the selected bank BK<i> corresponding to the read address ADR1 is set to the active state.

The memory device 1 executes a first read operation (cell data read) for the selected bank BK<i> of the active state. As shown in (a) of FIG. 9 described above, a read current IRD1 is supplied to each selected cell MC-S by the driver circuit 130.

Thus, the sense amplifier circuit 140 acquires a plurality of sense signals from a plurality of selected cells MC-S in the selected bank BK<i> of the active state.

<Time t11a>

After the first read operation is completed, the memory device 1 performs a reset operation for the bank BK<i> of the active state at time t11a. As shown in (b) of FIG. 9 described above, a write current IWD1 is supplied to each selected cell MC-S by the driver circuit 130.

Thus, reference data is written into each selected cell MC-S. As a result, each of the plurality of selected cells MC-S within the selected bank BK<i> in the active state is set to the reset state.

<Time t12>

After the completion of the reset operation, at time t12, the memory device 1 performs a second read operation (reference data read) for the selected bank BK<i> of the active state. As in (c) of FIG. 9 described above, a read current IRD2 is supplied to each selected cell MC-S by the driver circuit 130.

Thus, the sense amplifier circuit 140 acquires a plurality of sense signals (reference signals) from a plurality of selected cells MC-S within the selected bank BK<i> in the active state.

After the second read operation (time t12), in the selected bank BK<i>, the sense amplifier circuit 140 determines data stored in the selected cells MC-S, based on the two sense signals of each selected cell MC.

Figure 12:
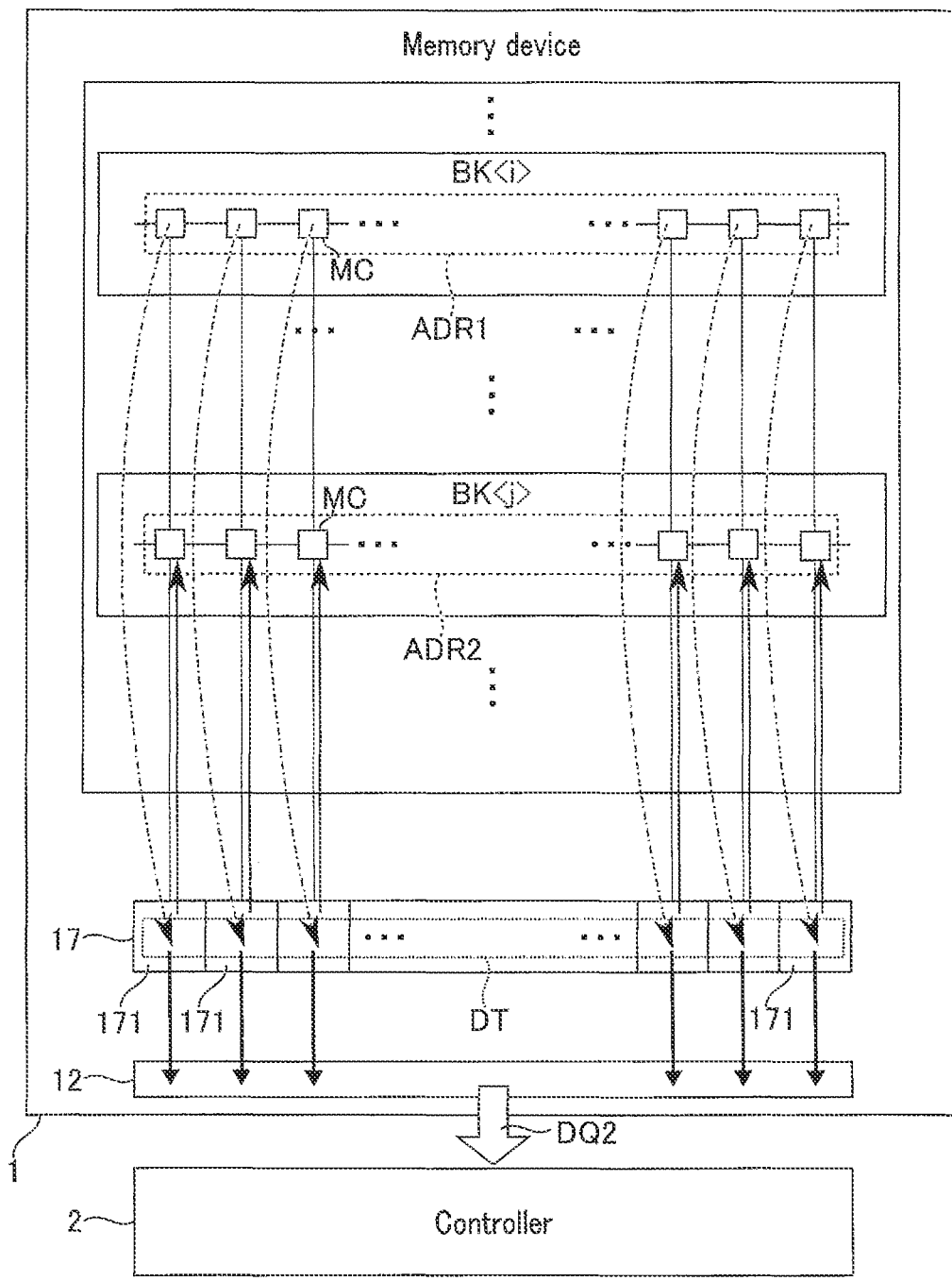
FIG. 12 is a diagram showing an operation example of the memory device according to the embodiment.

As shown in FIG. 12, the determined data is transferred from the selected bank BK<i> to the bank buffer circuit 17. Each buffer 171 in the bank buffer circuit 17 temporarily stores 1-bit data transferred from each selected cell MC.

Thus, one page of data DT is stored in the bank buffer circuit 17.

<Time t11b>

As described above, in the present embodiment, the memory device 1 receives a write-back address (a wear leveling address) ADR2 through the interface circuit 11 after the read command CMD1.

In this case, the memory device 1 recognizes, based on the write-back address ADR2, that a write-back operation including wear leveling processing is to be performed for the bank BK<j> indicated by the write-back address ADR2.

Therefore, when the memory device 1 receives the write-back address ADR2 after the read command CMD1, the memory device 1 executes reset processing for the plurality of memory cells MC in the bank BK<j> indicated by the write-back address ADR2.

For example, as shown in FIG. 11, at time t11b, the memory device 1 performs reset processing for the memory cells MC of the write-back address ADR2 after the reset operation for the selected cells MC of the read address ADR1.

As can be seen from the above, each bank BK can operate independently of each other.

Therefore, the reset processing for a bank (a write bank) BK<j> can be partially performed in parallel with the read of second data from a bank (a read bank) BK<i>.

<Time t2>

As shown in FIG. 10, at time t2, i.e., at the time when preparations for data transfer are considered to be made, the controller 2 sends a response signal RSPr regarding data read to the host device 9 via a response pin based on the NVDIMM standard.

The controller 2 changes the response signal RSPr from the "H" level to the "L" level in accordance with states of preparations for data transfer in the memory device 1 (for example, whether data is stored in the bank buffer circuit 17).

The controller 2 notifies the host device 9 that data transfer is ready, by means of an "L" level response signal RSPr. The "L" level response signal RSPr is also referred to as a ready signal.

The host device 9 receives the "L" level response signal RSPr.

In the example shown in FIG. 10, the write-back address ADR2 is transferred from the controller 2 to the memory device 1 when the signal level of the response signal RSPr is an "H" level. It should be noted that the write-back address ADR2 may be transferred from the controller 2 to the memory device 1 when the signal level of the response signal RSPr is an "L" level.

<Time t3>

The host device 9 sends the command SEND to the controller 2 in response to the "L" level response signal RSPr. The command SEND is a command for instructing the memory module MM to transfer data to the host device 9.

<Time t4>

The controller 2 receives the command SEND. Based on the command SEND, the controller 2 issues a command (BRD)CMD2 to the memory device 1. The command CMD2 is a signal set that instructs the memory device 1 to transfer data stored in bank buffer circuit 17.

The memory device 1 receives the command CMD2 through the interface circuit 11. The memory device 1 executes internal processing for data transfer in response to the command CMD2. For example, the command CMD2 is supplied to the memory device 1 during or after the execution of the second read operation in the selected bank BK<i>.

<Time t5>

At time t5, the memory device 1 starts data transfer in accordance with the command CMD2.

As shown in FIG. 12, based on the command CMD2, the memory device 1 transfers the data DT stored in the bank buffer circuit 17 as the read data DQ2 to the controller 2 via the interface circuit 11.

For example, when one page of data has a data size of 128 bits, data DQ is transferred from the memory device 1 to the controller 2 in 16 cycles such that 8 bits (1 byte) are transferred in one cycle.

<Time t13>

The memory device 1 performs a write-back operation WB using the data stored in the bank buffer circuit 17, during the period between the reception of the command CMD2 (time t4) and the start of the transfer of data DQ2 (time t5). In the present embodiment, the write-back operation WB of the self-reference read SRR includes wear leveling processing LV.

As shown in FIG. 11, at time t13, the memory device 1 sets the bank BK<j> corresponding to the write-back address ADR2 to the active state.

As shown in FIG. 12, after the reception of the command CMD2, the memory device 1 writes the data DT stored in the bank buffer circuit 17 to a plurality of memory cells MC in the bank BK<j> indicated by the address ADR2. A write current IWR is supplied to a plurality of memory cells MC-W in the bank BK<j>. The bank BK<j> indicated by the address ADR2 is a bank (write bank) to which data is to be copied in the wear leveling processing LV.

As described above, a plurality of memory cells MC in the bank BK<j> corresponding to the address ADR2 are in the reset state ("0" data holding state). Therefore, for example, only a write current IWR2 may be supplied to the memory cell MC of the bank BK<j> in which the "1" data is to be written, without the write current IWR1 being supplied to the bank BK<j>.

In this manner, the data DT acquired from a selected cell MC of a certain bank BK<i> is written back to a plurality of memory cells MC of another bank BK<j> by the write-back operation WB, and the data DT is copied from the bank BK<i> to the bank BK<j> by the wear leveling processing LV performed between two banks BK<i> and BK<j>.

For example, the writing of data DT to the bank BK<j> by the write-back operation WB may be executed after time t5 such that it is substantially simultaneous (parallel) with the transfer of the data DQ2 to the controller 2.

After the write-back operation for the bank BK<j>, the selected cell MC-S in the selected bank BK<i> corresponding to the read address ADR1 maintains the reset state without data being written back in response to the read command CMD1. Therefore, after the read sequence is completed, all selected cells MC-S corresponding to the read address ADR1 store reference data (e.g., "0" data).

It should be noted that the write-back operation WB including the wear leveling processing LV may be executed within the memory device 1, before the command SEND is responded to and/or before the command CMD2 is transmitted and received.

<Time t6>

The controller 2 receives the data DQ2 transferred from the memory device 1. The controller 2 performs various kinds of processing, such as error detection and error correction, on the data DQ2.

At time t6, the controller 2 transfers data DQ1 corresponding to the data DQ2 to the host device 9. Information on the error detection and correction (ECC information) may be transferred to the host device 9 together with the data DQ1.

The host device 9 receives the data DQ1 (and the ECC information) from the controller 2. For example, the transfer of data DQ1 to the host device 9 is executed in 16 cycles, with 8 bits in each cycle.

In the manner described above, the read sequence of the memory device 1 and memory module (memory system) MM of the present embodiment is completed.

As described above, when an address (write-back address) ADR2 is received after reception of the read command CMD1, the memory device 1 of the embodiment executes the wear leveling processing LV in the read sequence. If the address ADR2 is not received (or transmitted) after the reception of the read command CMD1, the memory device 1 of the present embodiment may write back the data acquired from the read address ADR1 to the read address ADR1 by the normal write-back operation WB, without executing the wear leveling processing LV. In this case, the write-back operation WB may be performed using data held in the sense amplifier circuit 140, without using the data DT stored in the bank buffer circuit 17.

(3) Modification

A modification of the memory device 1 of the embodiment will be described with reference to FIG. 13.

FIG. 13 is a timing chart illustrating a modification of the memory device 1 of the embodiment.

As shown in FIG. 13, when the wear leveling processing LV during the read sequence is performed, the controller 2 may supply a prefix command CMDx to the memory device 1 of the embodiment.

The prefix command CMDx is sent from the controller 2 to the memory device 1 before the read address ADR1.

The prefix command CMDx notifies the memory device 1 that the wear leveling processing LV is to be executed (data copy is to be executed) on the data for which the write-back operation WB is to be performed.

By receiving the prefix command CMDx, the memory device 1 can recognize that a write-back address ADR2 is to be transmitted after the read address ADR1 and the read command CMD1.

As shown in FIG. 13, the reset operation for the memory cell MC of the write-back address ADR2 may be performed substantially at the same time as the reset operation for the memory cell of the read address ADR.

It should be noted that the reset operation before the write-back operation WB does not have to be performed for the write-back address ADR2.

In connection with the present embodiment, an example is shown in which data obtained from a certain address in the bank BK<i> is written back to another bank BK<j> during the wear leveling processing in a read sequence. In the present embodiment, data read from a certain address in the bank BK<i> may be written back to another address in the same bank BK<i> by the wear leveling processing. In this case, at least one of the row address and column address for which a write-back operation is to be performed in the bank BK<j> differs from the row address or column address for which a read operation is to be performed in the bank BK<i>.

(4) Conclusion

When a read sequence including self-reference read is used in a memory device such as an MRAM, the data in memory cells is destroyed by the write operation of reference data. Furthermore, in the self-reference read, data write-back (write-back operation) is performed for the memory cells in order to restore the destroyed data.

When data write is performed in the read sequence as well, the number of a write operation performed in the memory space of the memory device increases further.

The write operations can degrade the MTJ elements of the memory cells. Therefore, if the write operations are concentrated on a certain memory cell, the usage life of the memory device is shortened.

In order to smooth the wear of the memory cells, therefore, it is preferable that wear leveling processing is applied to a memory device that performs a read sequence including a write operation.

When the wear leveling processing is applied to a read sequence including a write operation, a general memory device performs the wear leveling processing in succession to the read sequence according to a command from the user.

In the general memory device, therefore, it takes a long time before a read sequence and wear leveling processing according to a certain command are completed.

Further, when wear leveling processing is applied to the read sequence, the general memory device executes the wear leveling processing by the same number of times as the read sequences, which are executed in response to the read commands from the user. Therefore, the general memory device consumes a large amount of power.

Furthermore, in the general memory device, if the frequency of wear leveling processing increases, the frequency of the memory device becoming busy also increases. When the wear leveling processing is executed, data read and data write are executed for the wear leveling processing separately from the operation sequences executed according to the commands from the user. Therefore, in the general memory device, the responsiveness to commands from the user deteriorates.

The memory device 1 and memory system MM of the present embodiment execute wear leveling processing that is made common to the data write-back (write-back operation), during the read sequence.

FIG. 14 is a schematic diagram for illustrating a comparative example of the memory device 1 of the embodiment. (a) of FIG. 14 shows how a read sequence and a wear leveling sequence are performed by the general memory device.

(b) of FIG. 14 shows how a read sequence including wear leveling processing is performed by the memory device 1 of the embodiment.

As shown in (a) of FIG. 14, the general memory device starts a read sequence at time ta.

The general memory device receives a read command and a read address within a certain period.

The general memory device performs operations for sensing and determining data by self-reference read, based on the command and the address. Thereafter, the general memory device executes a write-back operation for the read address.

The general memory device sends the obtained read data to the controller.

This ends the read sequence at time tb.

In this manner, the read sequence of the general memory device is executed during a period T1, which is from time ta to time tb.

After the read sequence is completed (e.g., at time tb), the general memory device starts a wear leveling sequence.

In the general wear leveling sequence, a general memory device receives a write address (a wear leveling address), a write command and write data during a certain period.

In response to the write command, the general memory device writes write data to the memory cell designated by the write address. In the wear leveling sequence, data is written to a write address different from the read address.

This ends the wear leveling sequence at time tc.

Thus, general wear leveling is performed during a period T2, which is from time tb to time tc.

The general memory device requires a total period Ta of the periods T1 and T2 from the start of the read sequence to the end of the wear leveling.

As shown in (b) of FIG. 14, in the memory system MM of the embodiment, the memory device 1 of the embodiment receives from the controller 2 a write-back address ADR2 different from a read address ADR1 in the read sequence, together with the read command CMD1 and the read address ADR1.

The memory device 1 of the embodiment performs operations for sensing and determining data in self-reference read, based on the read command CMD1 and read address ADR1.

For example, the write-back address ADR2 is sent to the memory device 1 in parallel with the self-reference read. In the embodiment, therefore, no extra period is occurred during the read sequence in order to receive the write-back address ADR2.

After the data is determined, the memory device 1 of the embodiment performs a write-back operation including wear leveling processing for the write-back address ADR2 different from the read address ADR1.

In the embodiment, therefore, the period for the wear leveling processing (a wear leveling sequence) is not occurred separately from the read sequence period.

Further, the memory device 1 of the present embodiment uses the data read by the self-reference read and held in the bank buffer circuit 17, as write data for the wear leveling processing.

In the embodiment, therefore, a period for transferring the write data for the wear leveling processing is not occurred.

In this manner, the memory device 1 of the present embodiment executes the wear leveling processing while simultaneously executing the write-back operation.

For example, the memory device 1 executes data transmission after the write-back operation including wear leveling processing is executed. The transmission of data may be performed in parallel with the write-back operation.

The transmission of data ends at a certain point of time.

The memory device 1 of the embodiment executes and ends the wear leveling processing and the read sequence within a period Tb shorter than the period Ta (=T1+T2). For example, the period Tb is substantially the same length as the execution period T1 in which the general memory device executes a read sequence.

As described above, the memory device 1 and memory system MM of the present embodiment can avoid a prolonged operation including the read sequence and the wear leveling processing.

In addition, the general memory device executes the read sequence and the wear leveling sequence as different sequences. In the general memory device, therefore, the power consumption caused by a write operation is occurred not only for the write-back operation but also for the data write of the wear leveling processing. Accordingly, in the general memory device, the power consumption for operation sequences including a read sequence and a wear leveling sequence is relatively large.

The memory device 1 of the present embodiment performs data write (data copy) for the wear leveling processing by utilizing the write-back operation of a read sequence.

Therefore, in the present embodiment, the write operation (data copy) for the wear leveling processing is included in the write-back operation. In the present embodiment, therefore, the write operation for the wear leveling processing is not performed independently of the write operation performed during the read sequence.

As a result, the memory device 1 and memory system MM of the present embodiment can suppress an increase in the number of write and an increase in the power consumption, by using both the write-back operation and the wear leveling processing.

As described above, the memory device and memory system of the present embodiment can improve the operating characteristics.

(5) Others

In connection with the embodiment, an example is shown in which the memory device 1 is an MRAM. Needless to say, however, the memory device 1 of the embodiment may be a memory device other than the MRAM. For example, the memory device 1 of the embodiment may be a resistance change memory (e.g., a ReRAM) using a transition metal oxide element as a memory element, a phase change memory (e.g., a PCRAM) using a phase change element as a memory element, or a ferroelectric memory (e.g., a FeRAM) using a ferroelectric element as a memory element.

In the memory device 1 of the embodiment, the semiconductor chip including the bank BK for which the write-back operation including the wear leveling processing is executed may be different from the semiconductor chip including the bank BK from which data is read. Also, the bank BK for which the write-back operation including the wear leveling processing is executed may be provided in a memory device different from the memory device including the bank BK from which data is read.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a first bank including a first memory cell;
a second bank including a second memory cell; and
a buffer circuit configured to temporarily stores data,
wherein, during a read sequence for the first memory cell, the first bank is configured to:
sense a first signal from the first memory cell,
set the first memory cell to a reset state after the first signal is sensed,
sense a second signal from the first memory cell in the reset state,
determine first data stored in the first memory cell, based on the first signal and the second signal, and
store the first data in the buffer circuit, and
the second bank is configured to:
write the first data in the buffer circuit to the second memory.

2. The memory device according to claim 1, further comprising:
an interface circuit configured to output the first data to a controller,
wherein
the second bank is further configured to write the first data to the second memory cell before the interface circuit outputs the first data in the buffer circuit to the controller.

3. The memory device according to claim 1, further comprising:
an interface circuit configured to receive a first address relating to the first bank, a first command indicating commands execution of the read sequence, and a second address relating to the second bank.

4. The memory device according to claim 3, wherein
the interface circuit is further configured to receive a second command indicating output of the first data after receiving the second address, and
the interface circuit is further configured to output the first data in the buffer circuit to the controller in response to the second command.

5. The memory device according to claim 3, wherein
the interface circuit is further configured to receive a second command indicating execution of wear leveling processing before reception of the first address.

6. The memory device according to claim 1, wherein
the second bank is further configured to set the second memory cell to the reset state in parallel with the first bank setting the first memory cells to the reset state.

7. The memory device according to claim 1, wherein
writing the first data to the second memory cell includes wear leveling processing and a write-back operation.

8. The memory device according to claim 1, wherein
the first memory cell is configured to maintain the reset state after completion of the read sequence.

9. The memory device according to claim 1, wherein
the first memory cell includes a magnetoresistive effect element, and a switching element coupled to the magnetoresistive effect element.

10. A memory system comprising:
a memory device including a first bank including a plurality of first memory cells, a second bank including a plurality of second memory cells, and a buffer circuit configured to temporarily store data; and
a controller configured to command a read sequence to the memory device,
wherein
when commanding the memory device to perform the read sequence for the first bank, the controller is configured to send to the memory device, a first address relating to the first bank, a first command commanding the read sequence, and a second address relating to the second address,
the memory device is configured to:
send first data from one or more memory cells included in the plurality of first memory cells and corresponding to the first address to the buffer circuit in response to the first command, and
write the first data in the buffer circuit to one or more memory cells included in the plurality of second memory cells and corresponding to the second address, before the first data is sent from the buffer circuit to the controller.

11. The memory system according to claim 10, wherein
in the read sequence, the first bank is configured to:
sense a first signal from the first memory cells,
set the first memory cells to a reset state after the first signal is sensed,
sense a second signal from the first memory cells in the reset state,
determine the first data in the first memory cells, based on the first signal and the second signal, and
store the first data in the buffer circuit.

12. The memory system according to claim 11, wherein
the second bank is configured to set the second memory cells to a reset state in parallel with the first bank setting the first memory cells to the reset state.

13. The memory system according to claim 10, wherein
the controller is further configured to send a second command commanding transfer of the first data to the memory device after the second address is sent to the memory device, and
the memory device is further configured to send the first data in the buffer circuit to the controller in response to the second command.

14. The memory system according to claim 10, wherein
the controller is further configured to send a third command commanding execution of wear leveling processing to the memory device, before the first address is sent, and
the memory device is further configured to write the first data to the one or more memory cells corresponding to the second address in response to the third command.

15. The memory system according to claim 10, wherein
writing the first data to the one or more memory cells corresponding to the second address includes wear leveling processing and a write-back operation of self-reference read.

16. The memory system according to claim 10, wherein
the one or more memory cells corresponding to the first address are configured to store second data different from the first data, after the read sequence is completed.

17. The memory system according to claim 10, wherein
the controller includes a memory configured to store first information for wear leveling, and
the controller is further configured to generate the second address, based on the first information.

18. The memory system according to claim 10, wherein
the controller is further configured to send a first signal indicating that data is ready for transfer, to a host device communicating with the controller, in response to the first command.

19. The memory system according to claim 10, wherein each of the plurality of first memory cells includes a magnetoresistive effect element and a switching element coupled to the magnetoresistive effect element.

* * * * *